United States Patent
Lee et al.

(10) Patent No.: US 10,068,530 B2
(45) Date of Patent: Sep. 4, 2018

(54) ORGANIC LIGHT-EMITTING DIODE DISPLAY AND METHOD OF DRIVING THE SAME

(71) Applicant: LG Display Co., Ltd., Seoul (KR)

(72) Inventors: Youngjang Lee, Seoul (KR); Jeanhan Yoon, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 157 days.

(21) Appl. No.: 15/283,588

(22) Filed: Oct. 3, 2016

(65) Prior Publication Data

US 2017/0098413 A1    Apr. 6, 2017

(30) Foreign Application Priority Data

Oct. 5, 2015  (KR) .................. 10-2015-0139588

(51) Int. Cl.
  *G09G 3/3266*  (2016.01)
  *G11C 19/18*  (2006.01)
  *G11C 19/28*  (2006.01)
  *G09G 3/3233*  (2016.01)
  *G09G 3/3275*  (2016.01)

(52) U.S. Cl.
  CPC ......... *G09G 3/3266* (2013.01); *G09G 3/3233* (2013.01); *G11C 19/186* (2013.01); *G11C 19/28* (2013.01); *G09G 3/3275* (2013.01); *G09G 2300/0852* (2013.01); *G09G 2300/0861* (2013.01); *G09G 2310/0262* (2013.01); *G09G 2310/0286* (2013.01); *G09G 2310/0289* (2013.01); *G09G 2310/08* (2013.01); *G09G 2320/0233* (2013.01); *G09G 2330/021* (2013.01)

(58) Field of Classification Search
  CPC ........... G09G 3/32–3/3291; G09G 2310/0264; G09G 2310/0286
  See application file for complete search history.

(56) References Cited

U.S. PATENT DOCUMENTS

| | | | | |
|---|---|---|---|---|
| 9,489,882 B2* | 11/2016 | Kim | .................. | G09G 3/2092 |
| 9,490,276 B2* | 11/2016 | Kim | .................. | H01L 27/1225 |
| 9,542,889 B2* | 1/2017 | Lee | .................. | G09G 3/3266 |
| 9,595,546 B2* | 3/2017 | Kim | .................. | H01L 27/1251 |
| 9,711,088 B2* | 7/2017 | Na | .................. | G09G 3/3266 |

(Continued)

FOREIGN PATENT DOCUMENTS

KR    10-2015-0078714 A    7/2015

*Primary Examiner* — Patrick F Marinelli
(74) *Attorney, Agent, or Firm* — Morgan, Lewis & Bockius LLP

(57) ABSTRACT

Provided are an organic light-emitting diode (OLED) display and method of driving the same. An OLED display includes: a display panel including a plurality of pixels, each pixel including an OLED, an emission timing of each pixel being controlled in response to an EM signal, a shift register configured to generate an anti-phase EM signal based on gate shift clocks, and an inverter configured to: invert a phase of the anti-phase EM signal based on emission shift clocks, and generate the EM signal, wherein a driving frequency of the shift register and a driving frequency of the inverter are lower in a low-speed driving mode than in a normal driving mode, and wherein in the low-speed driving mode, an amplitude of the emission shift clocks is less than an amplitude of the gate shift clocks.

14 Claims, 28 Drawing Sheets

(56) References Cited

U.S. PATENT DOCUMENTS

| | | | |
|---|---|---|---|
| 2007/0063933 A1* | 3/2007 | Chung | G09G 3/3266 345/76 |
| 2008/0111837 A1 | 5/2008 | Kim et al. | |
| 2012/0044225 A1 | 2/2012 | Kim et al. | |
| 2012/0105390 A1* | 5/2012 | Kim | G09G 3/003 345/204 |
| 2014/0146033 A1 | 5/2014 | Koyama et al. | |
| 2015/0109279 A1* | 4/2015 | Gupta | G09G 3/3233 345/211 |
| 2015/0170568 A1* | 6/2015 | Lee | G09G 3/3233 345/690 |
| 2015/0187308 A1 | 7/2015 | Shin et al. | |
| 2015/0194121 A1* | 7/2015 | Lee | G09G 3/3266 345/212 |
| 2015/0243203 A1* | 8/2015 | Kim | G09G 3/2092 345/212 |
| 2015/0243220 A1* | 8/2015 | Kim | H01L 27/1225 345/215 |
| 2016/0042691 A1* | 2/2016 | Na | G09G 3/3266 345/205 |
| 2016/0240565 A1* | 8/2016 | Kim | H01L 27/1251 |
| 2017/0004766 A1* | 1/2017 | Cho | G06F 1/1652 |
| 2017/0025068 A1* | 1/2017 | Jeoung | G11C 19/28 |
| 2017/0061875 A1* | 3/2017 | Cho | G09G 3/3233 |
| 2017/0092191 A1* | 3/2017 | An | G09G 3/3233 |
| 2017/0098413 A1* | 4/2017 | Lee | G11C 19/28 |

\* cited by examiner

ORGANIC LIGHT-EMITTING DIODE DISPLAY AND METHOD OF DRIVING THE SAME

CROSS-REFERENCE TO RELATED APPLICATION(S)

This application claims the benefit of Korean Patent Application No. 10-2015-0139588, filed on Oct. 5, 2015, the entire disclosure of which is hereby incorporated by reference herein for all purposes.

BACKGROUND

1. Technical Field

The present disclosure relates to an organic light-emitting diode (OLED) display capable of driving at a low speed and a method of driving the same.

2. Discussion of the Related Art

An active matrix OLED display includes organic light-emitting diodes (OLEDs) capable of emitting light by themselves (i.e., self-emitting), and has advantages of a fast response time, a high emission efficiency, a high luminance, and a wide viewing angle. Each OLED includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When a driving voltage is applied to the anode electrode and the cathode electrode, holes passing through the hole transport layer HTL and electrons passing through the electron transport layer ETL move to the emission layer EML and form excitons. As a result, the emission layer EML generates visible light.

To reduce power consumption of the OLED display when there is a small change in an input image of the OLED display, a technology for driving the pixels at a low speed has been known. Because a refresh cycle of display data lengthens during a low-speed drive, image quality of the OLED display may be reduced. A main cause of reduction in the image quality is because a voltage level of an emission control signal changes during a data holding period in the low-speed drive.

More specifically, the OLED display controls the emission of the pixels through the emission control signal, and the emission control signal is generated by an emission driver. The emission driver may be directly formed in a non-display area (e.g., a bezel area) of a display panel. The emission driver includes a shift register generating an anti-phase emission control signal and an inverter that inverts a phase of the anti-phase emission control signal and generates an emission control signal. Output lines of the shift register for outputting the anti-phase emission control signal are connected to input terminals of the inverter. In this instance, the output lines of the shift register are disposed to intersect clock lines of the inverter to prevent an increase in the size of the bezel area attributable to the emission driver. At least one insulating layer is positioned between the output lines of the shift register and the clock lines of the inverter. Thus, the output lines of the shift register and the clock lines of the inverter are connected to each other through a parasitic capacitor.

As shown in FIG. 1, a ripple is generated in an anti-phase emission control signal EMB applied to output lines of a shift register because of an influence of emission shift clocks through a parasitic capacitor during a data holding period in a low-speed drive. The ripple reduces off-characteristics of some switches included in an inverter, and thus, drops a voltage level of an emission control signal EM output from the inverter. A reduction in the voltage level of the emission control signal EM changes an amount of electric current applied to OLEDs of the pixels, leading to a luminance drop.

SUMMARY

Accordingly, the present disclosure is directed to an organic light-emitting diode (OLED) display and a method of driving the same that substantially obviate one or more of the problems due to limitations and disadvantages of the related art.

An object of the disclosure is to provide an organic light-emitting diode (OLED) display and a method of driving the same capable of preventing a reduction in image quality by minimizing changes in a voltage of an emission control signal during a low speed drive.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided an organic light-emitting diode (OLED) display, including a display panel including a plurality of pixels, each pixel including an OLED, an emission timing of each pixel being controlled in response to an EM signal, a shift register configured to generate an anti-phase EM signal based on gate shift clocks, and an inverter configured to: invert a phase of the anti-phase EM signal based on emission shift clocks, and generate the EM signal, wherein a driving frequency of the shift register and a driving frequency of the inverter are lower in a low-speed driving mode than in a normal driving mode, and wherein in the low-speed driving mode, an amplitude of the emission shift clocks is less than an amplitude of the gate shift clocks.

In another aspect, there is provided an organic light-emitting diode (OLED) display, including: a display panel including a plurality of pixels, each pixel including an OLED, an emission timing of each pixel being controlled in response to an EM signal, a shift register configured to generate an anti-phase EM signal based on gate shift clocks, and an inverter configured to: invert a phase of the anti-phase EM signal based on emission shift clocks, and generate the EM signal, wherein the shift register is further configured to supply the anti-phase EM signal to an input node of the inverter through an output line, and wherein the inverter includes a ripple suppression capacitor connected between the input node and an input terminal of a gate low voltage, the ripple suppression capacitor being configured to suppress a ripple on the anti-phase EM signal.

In another aspect, there is provided a method of driving an organic light-emitting diode (OLED) display including a display panel having a plurality of pixels, each pixel including an OLED, an emission timing of each pixel being controlled in response to an EM signal, the method comprising: generating, by a shift register, an anti-phase EM signal based on gate shift clocks; and by an inverter: inverting a phase of the anti-phase EM signal based on emission shift clocks; and generating the EM signal, wherein a driving frequency of the shift register and a driving frequency of the inverter are lower in a low-speed driving mode than in a normal driving mode, and wherein in the low-speed driving mode, an amplitude of the emission shift clocks is less than an amplitude of the gate shift clocks.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
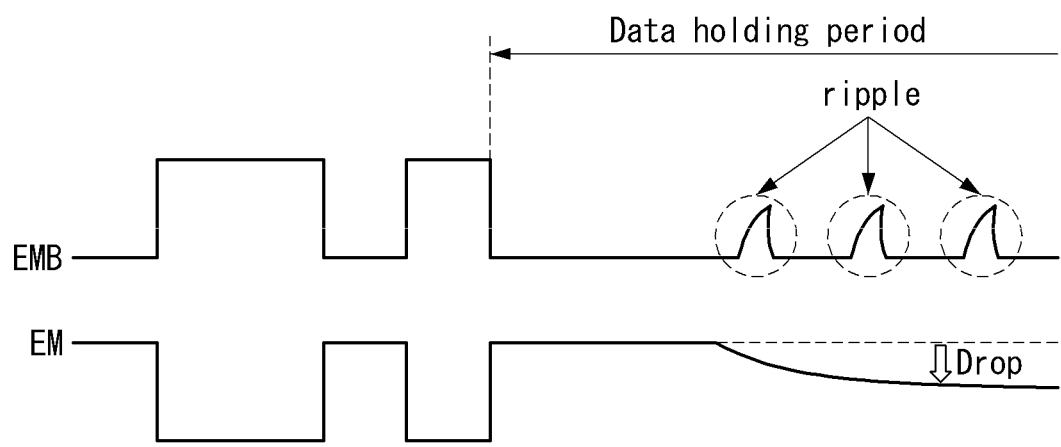
FIG. 1 illustrates that a luminance drop is generated in a related art organic light-emitting diode (OLED) display.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, example embodiments of the present disclosure will be described in detail with reference to the accompanying drawings.

Figure 2:
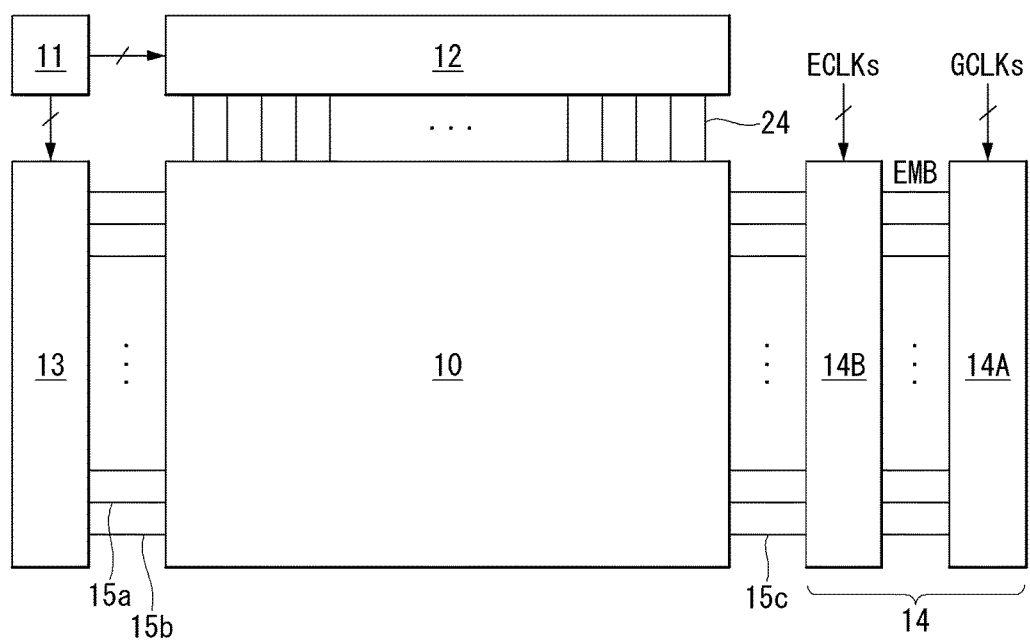
FIG. 2 illustrates an OLED display according to an example embodiment.
Figure 3:
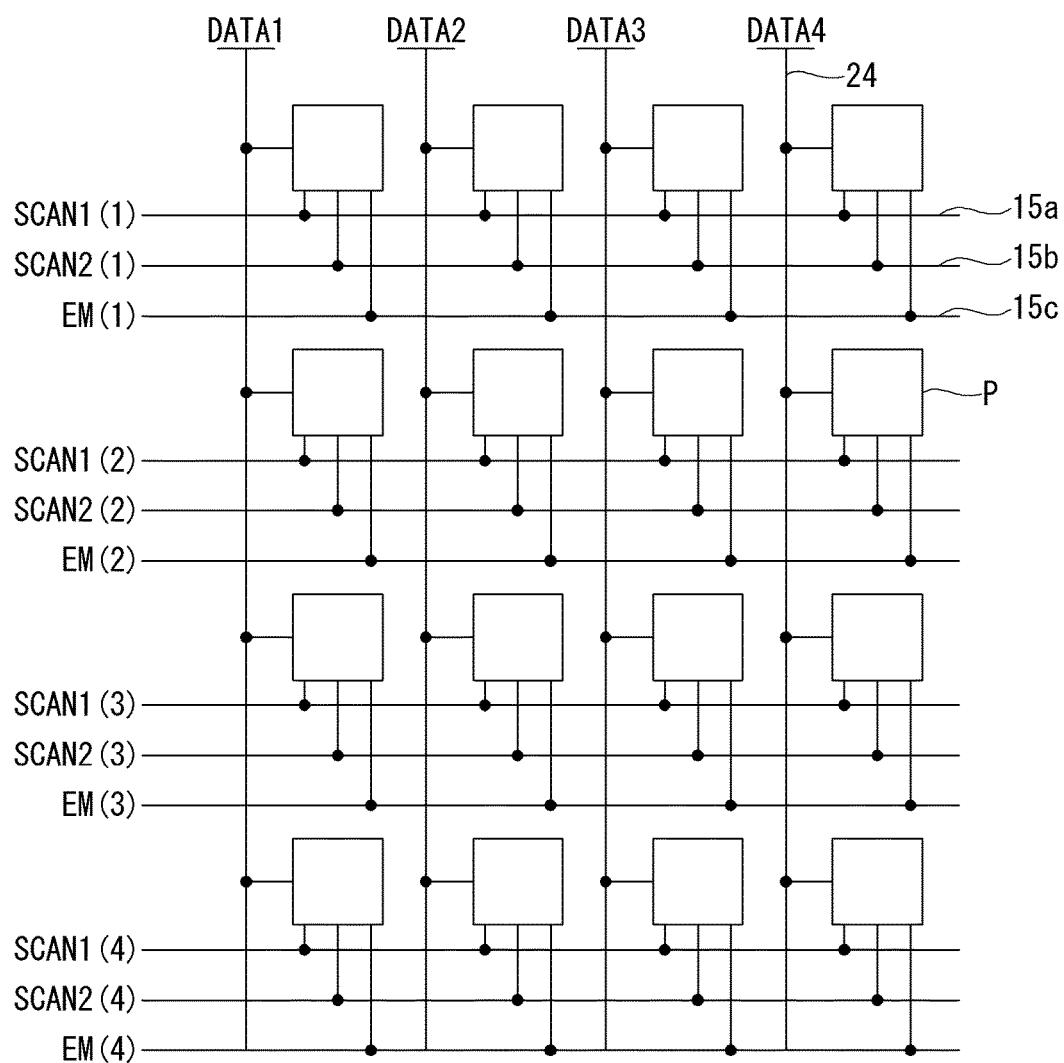
FIG. 3 illustrates a pixel array according to an example embodiment.

FIG. 2 illustrates an organic light-emitting diode (OLED) display according to an example embodiment. FIG. 3 illustrates a pixel array according to an example embodiment.

With reference to the examples of FIGS. 2 and 3, an OLED display according to an embodiment may include a display panel 10 and a display panel driving circuit. The display panel driving circuit may write data of an input image to pixels P of the display panel 10. The display panel driving circuit may include a data driver 12, a scan driver 13, and an emission driver 14 that may be driven under the control of a timing controller 11.

The display panel driving circuit may operate in a low-speed driving mode. The low-speed driving mode may reduce a driving frequency that enables the display panel driving circuit to operate, when the analysis of an input image shows that the input image has not changed during a predetermined number of frame periods (e.g., when a still image is input for more than a predetermined period of time), thereby increasing a data write cycle of the pixels P. As a result, power consumption of the OLED display is reduced. A refresh rate, at which pixel data is updated in the display panel 10, may be less in the low-speed driving mode than in a normal driving mode. In other words, when a driving frequency in the normal driving mode is "K" Hz, a driving frequency in the low-speed driving mode may be less than "K" Hz. The low-speed driving mode is not limited to when a still image is input. For example, the display panel driving circuit may operate in the low-speed driving mode when a display device operates in a standby mode or when a user command or an input image is not input to the display panel driving circuit for more than a predetermined period of time.

On the display panel 10, a plurality of data lines 24 and a plurality of gate lines 15 intersect each other, and the pixels P are arranged in a matrix. Data of an input image is displayed on a pixel array of the display panel 10. The display panel 10 may further include an initialization voltage line 16 (see FIG. 4) and a VDD line that supplies a high potential driving voltage VDD to the pixels P.

Figure 4:
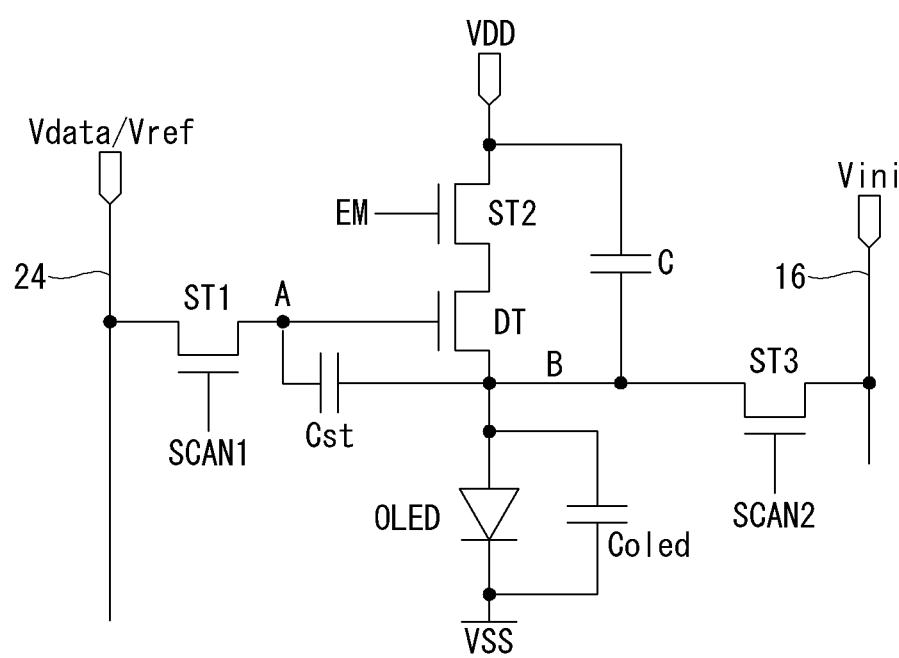
FIG. 4 is a circuit diagram illustrating an example of a pixel circuit shown in FIG. 3.

The gate lines 15 may include a plurality of first scan lines 15*a* supplied with a first scan signal SCAN1 (see FIGS. 3-4), a plurality of second scan lines 15*b* supplied with a second scan signal SCAN2 (see FIGS. 3-4), and a plurality of emission (EM) signal lines 15*c* supplied with an emission control signal ("EM signal")(see FIGS. 3-4). Each pixel P may be divided into a red subpixel, a green subpixel, and a blue subpixel to produce colors. Each pixel P may further include a white subpixel. One data line 24, one first scan line 15*a*, one second scan line 15*b*, one EM signal line 15*c*, the VDD line, etc., may be connected to each pixel P.

In the normal driving mode, the data driver 12 may convert digital data DATA of an input image received from the timing controller 11 into a data voltage in each frame, and then may supply the data voltage to the data lines 24. The data driver 12 may output the data voltage using a digital-to-analog converter (DAC) that may convert digital data to an analog gamma compensation voltage. In the low-speed driving mode, the driving frequency of the data driver 12 may be reduced under the control of the timing controller 11. For example, in the normal driving mode, the data driver 12 may output a data voltage for an input image in every frame period. On the other hand, in the low-speed driving mode, the data driver 12 may output a data voltage for an input image during some frames, and may not generate an output during the remaining frames. Accordingly, the driving frequency and power consumption of the data driver 12 may be much lower in the low-speed driving mode than in the normal driving mode.

A multiplexer (not shown) may be disposed between the data driver 12 and the data lines 24 of the display panel 10. The multiplexer may distribute a data voltage output from the data driver 12 through one output channel to N data lines 24, and thus can reduce the number of output channels in the data driver 12, where N is a positive integer equal to or greater than 2. The multiplexer may be omitted, depending on the resolution and use of the display device.

The scan driver 13 may output the first and second scan signals SCAN1 and SCAN2 under the control of the timing controller 11, and may select the pixels charged with the data voltage. The scan driver 13 may be implemented as a shift register. Thus, the scan driver 13 may shift the first and second scan signals SCAN1 and SCAN2, and may sequentially supply the first and second scan signals SCAN1 and SCAN2 to the first and second scan lines 15*a* and 15*b*.

The emission driver 14 may output the EM signal EM under the control of the timing controller 11, and may control emission timing of the pixels charged with the data voltage. The emission driver 14 may include a shift register 14A, that may generate an anti-phase EM signal EMB based on gate shift clocks GCLKs. The emission driver 14 may also include an inverter 14B that may invert a phase of the anti-phase EM signal EMB based on emission shift clocks ECLKs, and may generate an EM signal EM. The scan driver 13 and the emission driver 14 may be formed directly on a substrate of the display panel 10 together with the pixel array, e.g., through a GIP (gate-driver-in-panel) process.

The timing controller 11 may receive digital data DATA of an input image and a timing signal synchronized with the digital data DATA from a host system (not shown). The timing signal may include a vertical sync signal Vsync, a horizontal sync signal Hsync, a dot clock signal DCLK, and a data enable signal DE, and the like. The host system may be one of: a television system, a set-top box, a navigation system, a DVD player, a Blu-ray player, a personal computer (PC), a home theater system, a phone system, and other systems that include or operate in conjunction with a display. Embodiments are not limited to these examples.

The timing controller 11 may include a low-speed driving control module reducing a driving frequency of the display panel driving circuit. As described above, it should be noted that the low-speed driving mode is not limited to still images.

In the normal driving mode, the timing controller 11 may control operation timings of the display panel driving circuit (e.g., 12, 13, and 14) at a frame frequency of (input frame frequency×i) Hz, which equals i times the input frame frequency, where "i" is a positive integer greater than 0. The input frame frequency may be 60 Hz in the NTSC (National Television Standards Committee) system and may be 50 Hz in the PAL (Phase-Alternating Line) system. In the low-speed driving mode, the timing controller 11 may reduce the driving frequency of the display panel driving circuit (e.g., 12, 13, and 14). For example, the timing controller 11 may reduce the driving frequency of the display panel driving circuit (e.g., 12, 13, and 14) to about 1 Hz so that the data DATA (e.g., DATA1 to DATA4) may be written to the pixels P once per second. The driving frequency for the low-speed driving mode is not limited to 1 Hz. As a result, in the low-speed driving mode, the pixels P of the display panel 10 may not be charged with a new data voltage for most of the time and may be held at a previous data voltage that has already been charged.

The timing controller 11 may generate a data timing control signal for controlling operation timing of the data driver 12 and a gate timing control signal for controlling operation timing of the scan driver 13 and the emission driver 14, based on timing signals Vsync, Hsync, and DE received from the host system.

The data timing control signal may include a source start pulse SSP, a source sampling clock SSC, a source output enable signal SOE, etc. The source start pulse SSP may control a sampling start timing of the data driver 12. The source sampling clock SSC may be a clock for shifting a data sampling timing. In one example, if a signaling interface between the timing controller 11 and the data driver 12 is a mini low voltage differential signaling (LVDS) interface, the source start pulse SSP and the source sampling clock SSC may be omitted.

The gate timing control signal may include a gate start pulse VST, a gate shift clock GCLK, an emission shift clock ECLK, a gate output enable signal GOE, etc. In an example of a GIP circuit, the gate output enable signal GOE may be omitted. The gate start pulse VST may be generated once at an initial stage of each frame period and may be input into the shift register of each of the scan driver 13 and the emission driver 14. The gate start pulse VST may control start timing the first and second scan signals SCAN1 and SCAN2 and the EM signal EM, each of which may be first output in each frame period. The gate shift clock GCLK may be input to the shift register of each of the scan driver 13 and the emission driver 14, and may control shift timing of the shift register. The emission shift clock ECLK may be input to the inverter of the emission driver 14, and may control shift timing of the inverter. The gate output enable signal GOE may define output timing of the scan signal.

Figure 5:
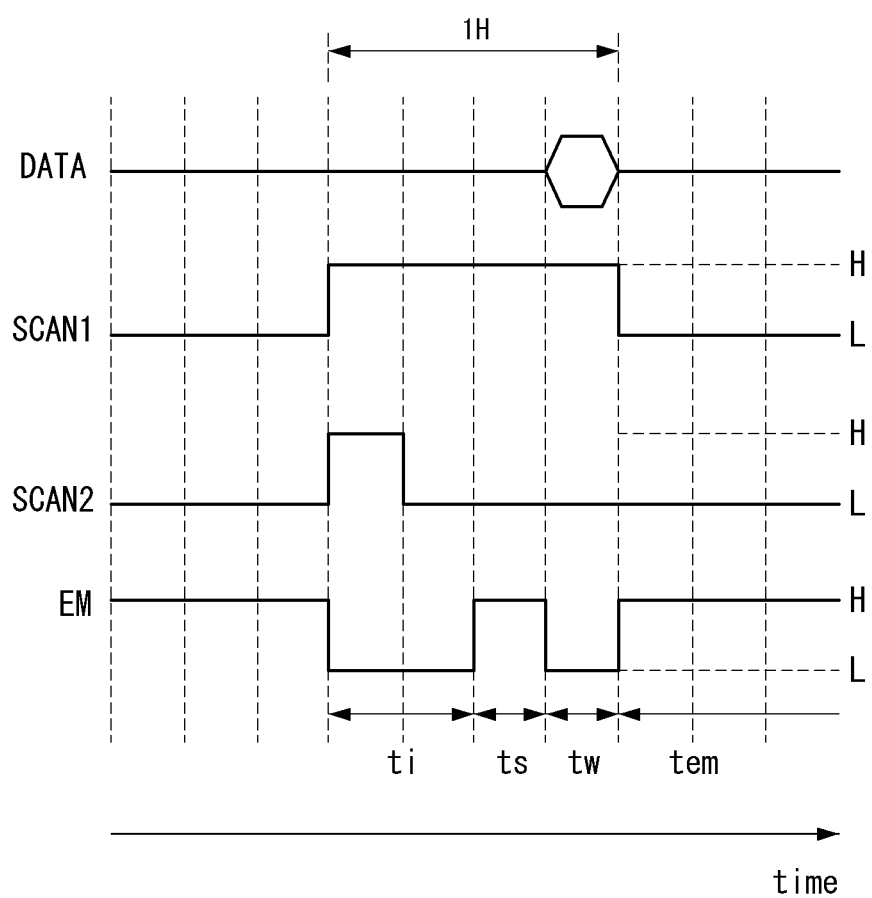
FIG. 5 is a timing diagram illustrating signals input to a pixel shown in FIG. 3.

FIG. 4 is a circuit diagram illustrating an example of a pixel shown in FIG. 3. FIG. 5 is a timing diagram illustrating signals input to a pixel shown in FIG. 3.

The circuit of FIG. 4 shows an example of a pixel, and embodiments are not limited to the circuit shown in FIG. 4. With reference to the examples of FIGS. 4 and 5, each pixel may include an organic light-emitting diode (OLED), a plurality of thin film transistors (TFTs) ST1 to ST3 and DT, and a storage capacitor Cst. A capacitor C may be connected between a drain electrode of the second TFT ST2 and a second node B. In the FIG. 4 example, "Coled" denotes the parasitic capacitance of the OLED.

The OLED may emit light by an amount of electric current that is adjusted by the driving TFT DT based on a data voltage Vdata. A current path in the OLED may be switched on and off by the second switching TFT ST2. The OLED may include organic compound layers between an anode and a cathode. The organic compound layers may include, but are not limited to, a hole injection layer HIL, a hole transport layer HTL, an emission layer EML, an electron transport layer ETL, and an electron injection layer EIL. The anode of the OLED may be connected to the second node B, and the cathode may be connected to a VSS line to which a low voltage VSS (e.g., ground) is applied.

The TFTs ST1 to ST3 may be, but are not limited to, n-type metal-oxide-semiconductor field-effect transistor (MOSFETs), for example, as illustrated in FIG. 4. In another example, the TFTs ST1 to ST3 and DT may be implemented as p-type MOSFETs. In this case, the phases of the scan signals SCAN1 and SCAN2 and EM signal EM may be inverted from those shown in the examples illustrated herein. Each TFT may be implemented as one of: an amorphous silicon (a-Si) transistor, a polycrystalline silicon transistor, an oxide transistors, or a combination thereof. Embodiments are not limited to these examples.

An off-time of the switching TFTs ST1 to ST3 used as switching elements may be lengthened in the low-speed driving mode. Thus, the switching TFTs ST1 to ST3 may be implemented as oxide transistors including oxide semiconductor material to reduce the off-current, e.g., leakage current, of the switching TFTs ST1 to ST3 in the low-speed driving mode. By implementing the switching TFTs ST1 to ST3 as oxide transistors, embodiments may reduce the off-current of the switching TFTs ST1 to ST3 and may reduce power consumption. In addition, embodiments may prevent a reduction in the voltage of the pixel resulting from the leakage current, mad may improve flicker prevention.

The driving TFT DT, which may be used as a driving element, and the switching TFT S2, which may have a short off-time, may be polycrystalline silicon transistors including a polycrystalline semiconductor material. Because the polycrystalline silicon transistors may provide high electron mobility, an amount of electric current of the OLED may be increased, leading to higher efficiency and improvement in power consumption.

The anode of the OLED may be connected to the driving TFT DT via the second node B. The cathode of the OLED may be connected to a ground voltage source and supplied with a ground voltage VSS. The ground voltage VSS may be a zero voltage (or earth ground), a negative voltage, and/or a low-level DC voltage.

The driving TFT DT may be a driving element that adjusts a current Ioled flowing in the OLED based on a gate-to-source voltage Vgs. The driving TFT DT may include a gate electrode connected to a first node A, a drain electrode connected to the source of the second switching TFT ST2, and a source electrode connected to the second node B. The storage capacitor Cst may be connected between the first node A and the second node B and holds the gate-to-source voltage Vgs of the driving TFT DT.

The first switching TFT ST1 may be a switching element that supplies a data voltage Vdata to the first node A in response to the first scan signal SCAN1. The first switching TFT ST1 may include a gate electrode connected to a first scan line, a drain electrode connected to a data line 24, and a source electrode connected to the first node A. The first scan signal SCAN1 may be generated at an on level (e.g., H) during about one horizontal period 1H to turn on the first switching TFT ST1, and may be inverted to an off level (e.g., L) during an emission period tem to turn off the first switching TFT ST1.

The second switching TFT ST1 may be a switching element that switches the current flowing in the OLED on or off in response to an EM signal EM. The drain electrode of the second switching TFT ST2 may be connected to a VDD line supplied with a high potential driving voltage VDD. The source electrode of the second switching TFT ST2 may be connected to the drain electrode of the driving TFT DT. The gate electrode of the second switching TFT ST2 may be connected to an EM signal line and supplied with an EM signal. The EM signal EM may be generated at an on level during a sampling period is to turn on the second switching TFT ST2, and may be inverted to an off level during an initialization period ti and a programming period tw to turn off the second switching TFT ST2. Also, the EM signal EM may be generated at an on level during the emission period tem to turn on the second switching TFT ST2, thereby forming a current path of the OLED. The EM signal EM may be generated as an alternating current (AC) signal that swings between the on level and the off level based on a predetermined pulse width modulation (PWM) duty ratio to switch the current path of the OLED on and off.

The third switching TFT ST3 may supply an initialization voltage Vini to the second node B in response to a second scan signal SCAN2 during the initialization period ti. The third switching TFT ST3 may include a gate electrode connected to a second scan line, a drain electrode connected to an initialization voltage line RL, and a source electrode connected to the second node B. The second scan signal SCAN2 may be generated at an on level during the initialization period ti to turn on the third switching TFT ST3, and may be maintained at an off level during the remaining period, thereby controlling the third switching TFT ST3 to be in the off state.

The storage capacitor Cst may be connected between the first node A and the second node B and may store a voltage difference between the first node A and the second node B. The storage capacitor Cst may sample a threshold voltage Vth of the driving TFT DT in a source follower manner. The capacitor C may be connected between the VDD line and the second node B. When there is a change in a voltage of the first node A based on the data voltage Vdata scanned in the programming period tw, a change amount of the voltage may be distributed among the capacitors Cst and C, and may reflect the distribution result to the second node B.

A scanning period of the pixel may be divided into an initialization period ti, a sampling period ts, a programming period tw, and an emission period tem. The scanning period may be set to about one horizontal period 1H, during which data may be written to the pixels arranged on one horizontal line of the pixel array. During the scanning period, the threshold voltage of the driving TFT DT of the pixel may be sampled, and the gate-to-source voltage of the driving TFT DT may be compensated by an amount of the threshold voltage Vth.

When the initialization period ti begins, the first and second scan signals SCAN1 and SCAN2 may rise and may be generated at an on level. At the same time, the EM signal EM may fall and may change to an off level. During the initialization period ti, the second switching TFT ST2 may be turned off to switch off the current path of the OLED. The first and third switching TFTs ST1 and ST3 may be turned on during the initialization period ti. During the initialization period ti, a predetermined reference voltage Vref may be supplied to the data line 24. During the initialization period ti, the voltage of the first node A may be initialized to the reference voltage Vref, and the voltage of the second node B may be initialized to a predetermined initialization voltage Vini. After the initialization period ti, the second scan signal SCAN2 may change to an off level, and may turn off the third switching TFT ST3. The on level may be a gate voltage level of the TFT at which the switching TFTs ST1 to ST3 of the pixel are turned on. The off level may be a gate voltage level of the TFT, at which the switching TFTs ST1 to ST3 of the pixel are turned off. In FIG. 5, "H" means "high" and indicates the on level, and "L" means "low" and indicates the off level.

During the sampling period ts, the first scan signal SCAN1 may remain at the on level, and the second scan signal SCAN2 may remain at the off level. The EM signal EM may rise and change to the on level when the sampling period ts begins. During the sampling period ts, the first and second switching TFTs ST1 and ST2 may be turned on. During the sampling period ts, the second switching TFT ST2 may be turned on in response to the EM signal EM having the on level. During the sampling period ts, the first switching TFT ST1 may remain in an on state by first scan signal SCAN1 having the on level. During the sampling period ts, the reference voltage Vref is supplied to the data line 24. During the sampling period ts, the voltage of the first node A may be maintained at the reference voltage Vref, whereas the voltage of the second node B may rise due to a drain-source current Ids. According to the source follower configuration, the gate-source voltage Vgs of the driving TFT DT may be sampled as the threshold voltage Vth of the driving TFT DT, and the sampled threshold voltage Vth may be stored in the storage capacitor Cst. During the sampling period ts, the voltage of the first node A may be the reference voltage Vref, and the voltage of the second node B is (Vref−Vth).

During the programming period tw, the first switching TFT ST1 may remain in the on state by the on level first scan signal SCAN1, and the other switching TFTs ST2 and ST3 may be turned off. During the programming period tw, a data voltage Vdata for an input image may be supplied to the data line 24. The data voltage Vdata may be applied to the first node A, and a result of distributing a voltage change amount (Vdata−Vref) of the first node A among the capacitors Cst and C may be applied to the second node B. In this way, the gate-to-source voltage Vgs of the driving TFT may be programmed. During the programming period tw, the voltage of the first node A may be the data voltage Vdata, and the voltage of the second node B may be (Vref−Vth+C'* (Vdata−Vref)), which is obtained by summing (Vref−Vth), which is set during the sampling period ts, and (C'*(Vdata−Vref)), which results from the voltage distribution between the capacitors Cst and C. Consequently, the gate-source voltage Vgs of the driving TFT DT may be programmed to (Vdata−Vref+Vth−C'*(Vdata−Vref)). Here, C'=Cst/(Cst+C).

When the emission period tem begins, the EM signal EM may rise and change back to the on level. On the other hand, the first scan signal SCAN1 may fall and change to the off level. During the emission period tem, the second switching TFT ST2 may remain in the on state, forming a current path of the OLED. The driving TFT DT may adjust an amount of electric current of the OLED depending on the data voltage during the emission period tem.

The emission period tem may continue from an end of the programming period tw until a start of an initialization period ti of a next frame. During the emission period tem, the current Ioled, which may be adjusted based on the gate-to-source voltage Vgs of the driving TFT DT, may flow through the OLED and may cause the OLED to emit light. During the emission period tem, the first and second scan signals SCAN1 and SCAN2 may be maintained at the off level, and therefore the first and second switching TFTs ST1 and ST3 may be turned off.

The current Ioled flowing in the OLED during the emission period tem is represented in Equation 1. The OLED may emit light by the current Ioled, and represents the brightness of an input image.

$$Ioled = \frac{k}{2}[(1 - C')(Vdata - Vref)]^2 \quad \text{[Equation 1]}$$

where k is a proportional constant determined by mobility, a parasitic capacitance, a channel capacity, etc. of the driving TFT DT.

Because Vth is included in Vgs, which may be programmed during the programming period tw, Vth may be canceled out from the Ioled in Equation 1. Accordingly, an influence of the threshold voltage Vth of a driving element, e.g., the driving TFT DT, on the current Ioled of the OLED may be removed.

Figure 6:
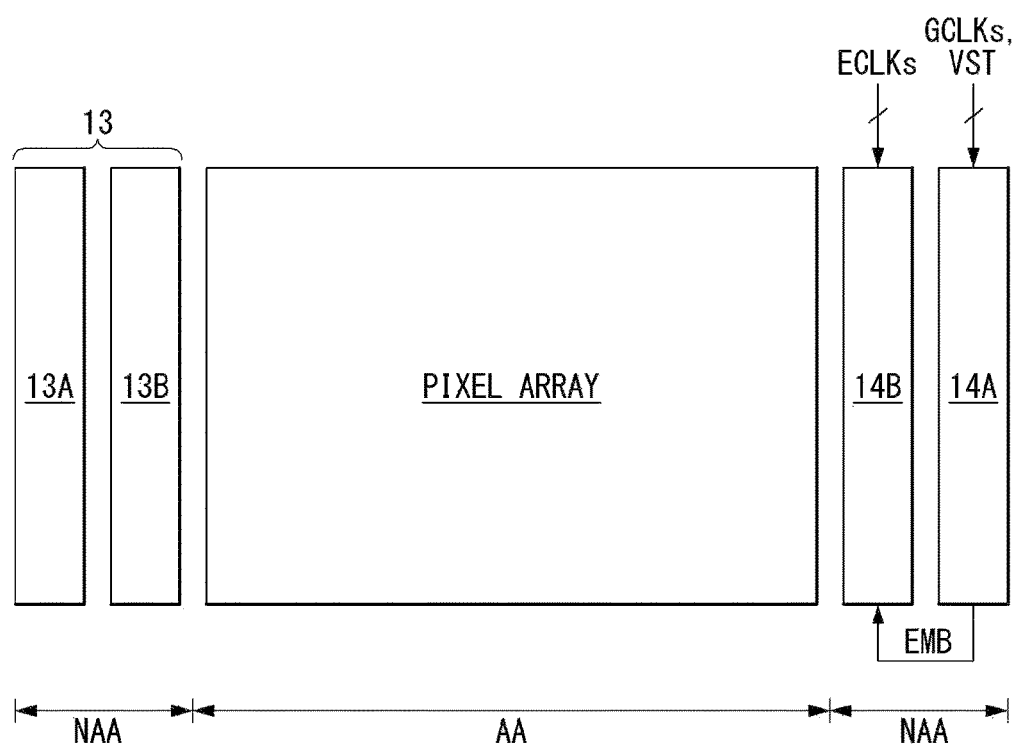
FIG. 6 illustrates a disposition of a scan driver and an emission driver.
Figure 7:
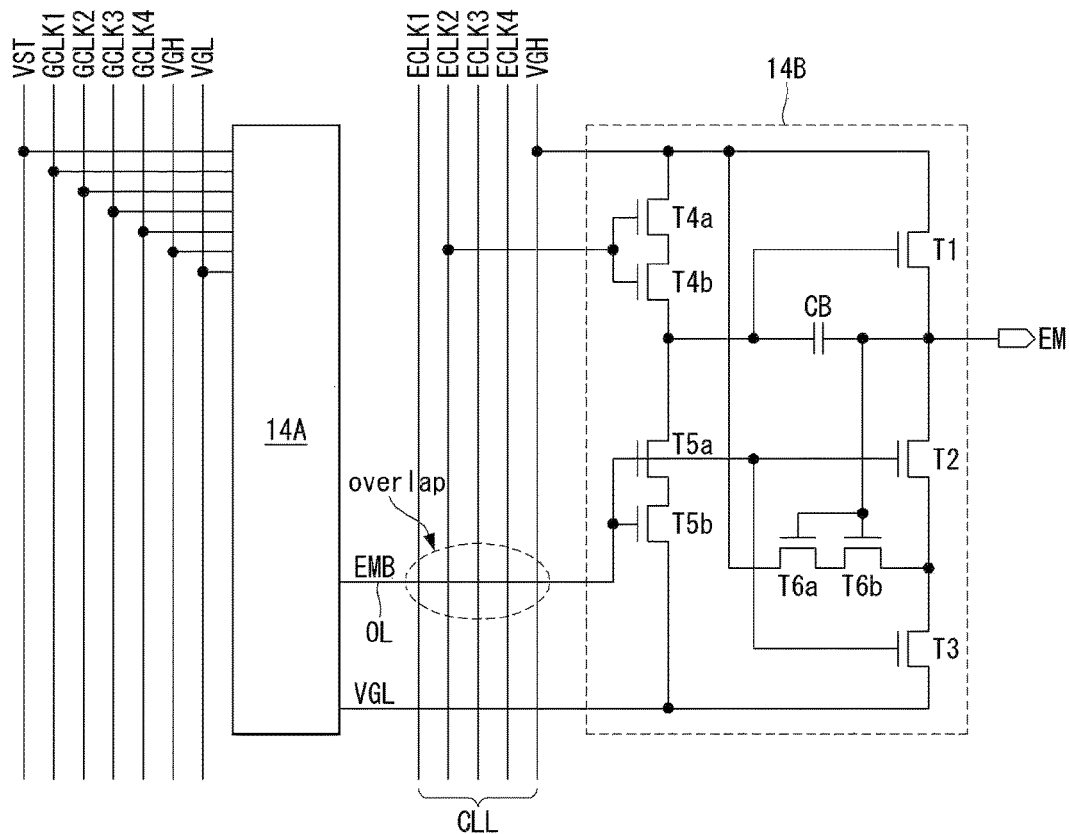
FIG. 7 illustrates an overlap between output lines of a shift register and clock lines of an inverter in an emission driver.

FIG. 6 illustrates a disposition of a scan driver and an emission driver. FIG. 7 illustrates an overlap between output lines of a shift register and clock lines of an inverter in an emission driver.

With reference to FIGS. 6 and 7, the scan driver 13 and the emission driver 14 may be disposed in the display panel 10 with the pixel array interposed between them. The pixel array may be in a display area AA of the display panel 10, the scan driver 13 may be on one side of a non-display area NAA of the display panel 10, and the emission driver 14 may be on the other side of the non-display area NAA of the display panel 10. The scan driver 13 may include a first scan driver 13A outputting a first scan signal SCAN1 in a line sequential manner and a second scan driver 13B outputting a second scan signal SCAN2 in the line sequential manner.

The emission driver 14 may include a shift register 14A generating an anti-phase EM signal EMB and an inverter 14B that inverts a phase of the anti-phase EM signal EMB and generates an EM signal EM. Output lines OL of the shift register 14A for outputting the anti-phase EM signal EMB may be connected to input terminals of the inverter 14B. In one example, as shown in FIG. 7, the output lines OL of the shift register 14A may intersect with emission shift clock lines CLL of the inverter 14B, to prevent an increase in the size of the bezel area attributable to the emission driver 14. At least one insulating layer may be between the output lines OL of the shift register 14A and the emission shift clock lines CLL of the inverter 14B. Thus, the output lines OL of the shift register 14A and the emission shift clock lines CLL of the inverter 14B may be connected to each other through a parasitic capacitor.

The parasitic capacitor may generate a ripple in the anti-phase EM signal EMB applied to the output lines OL of the shift register 14A when emission shift clocks ECLK1 to ECLK4 swing during a data holding period in the low-speed drive. The ripple may reduce off-characteristics of some switches included in the inverter 14B, and thus, may drop a voltage level of the EM signal EM output from the inverter 14B. Thus, a method for minimizing or preventing the ripple is described below.

Figure 8:
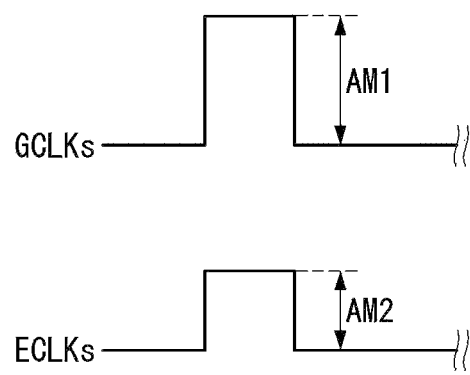
FIGS. 8 to 10 illustrate examples of reducing an amplitude of an emission shift clock applied to an inverter compared to an amplitude of a gate shift clock applied to a shift register, as a method for minimizing changes in a voltage of an emission control signal.
Figure 9:
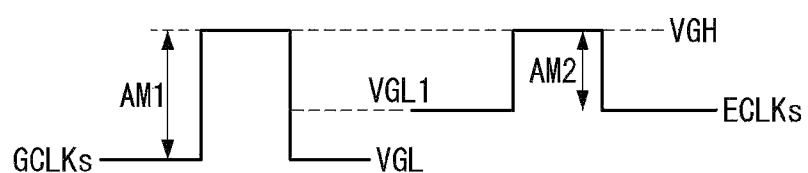
Figure 10:
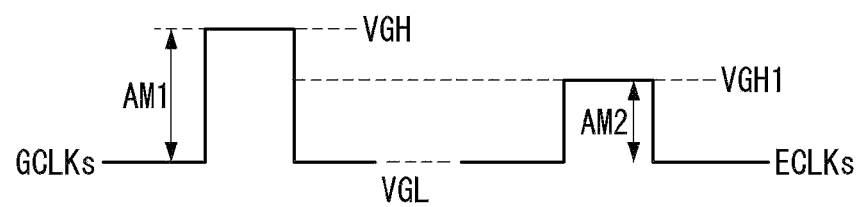

FIGS. 8 to 10 illustrate examples of reducing an amplitude of an emission shift clock applied to an inverter compared to an amplitude of a gate shift clock applied to a shift register, as a method for minimizing changes in a voltage of an EM signal.

The ripple may be generated by coupling between the emission shift clocks ECLK1 to ECLK4 and the anti-phase EM signal EMB applied to the output lines OL of the shift register 14A. Thus, the ripple may have a characteristic in that it is proportional to amplitudes of the emission shift clocks ECLK1 to ECLK4.

As shown in the FIG. 8 example, the timing controller 11 according to an embodiment may further reduce an amplitude AM2 of the emission shift clocks ECLKs applied to the inverter 14B compared to an amplitude AM1 of the gate shift clocks GCLKs applied to the shift register 14A to reduce a magnitude of the ripple.

To this end, as shown in the FIG. 9 example, the timing controller 11 may generate gate shift clocks GCLKs that are configured to swing between a gate high voltage VGH and a gate low voltage VGL, and may generate emission shift clocks ECLKs that are to swing between the gate high voltage VGH and a first gate low voltage VGL1. Further, the timing controller 11 may cause a level of the first gate low voltage VGL1 to be greater than a level of the gate low voltage VGL.

Alternatively, as shown in the FIG. 10 example, the timing controller 11 may generate gate shift clocks GCLKs that are configured to swing between the gate high voltage VGH and the gate low voltage VGL, and may generate emission shift clocks ECLKs that are configured to swing between a first gate high voltage VGH1 and the gate low voltage VGL. Further, the timing controller 11 may cause a level of the first gate high voltage VGH1 to be less than a level of the gate high voltage VGH.

Figure 12:
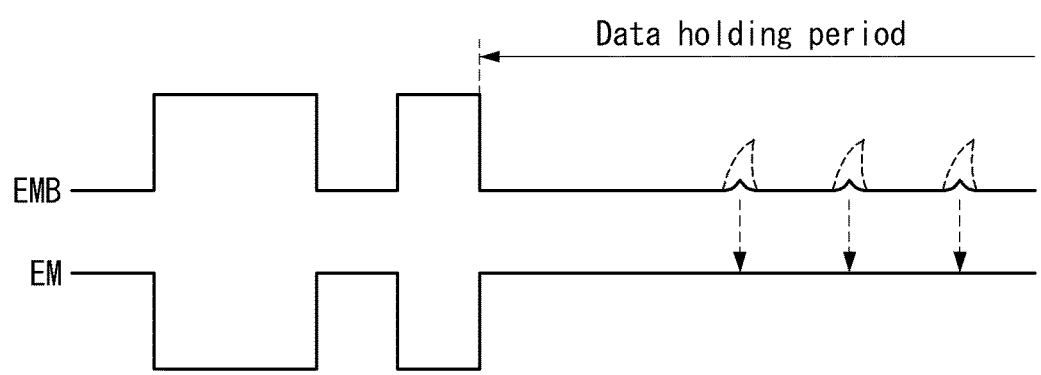
FIG. 12 illustrates that a luminance drop is minimized in an OLED display according to an example embodiment.

As shown in the FIG. 12 example, changes in a voltage of the EM signal EM output from the inverter 14B can be minimized by minimizing the magnitude of the ripple. Hence, the EM signal EM can be held at a voltage of a stable high level during the data holding period.

Figure 11:
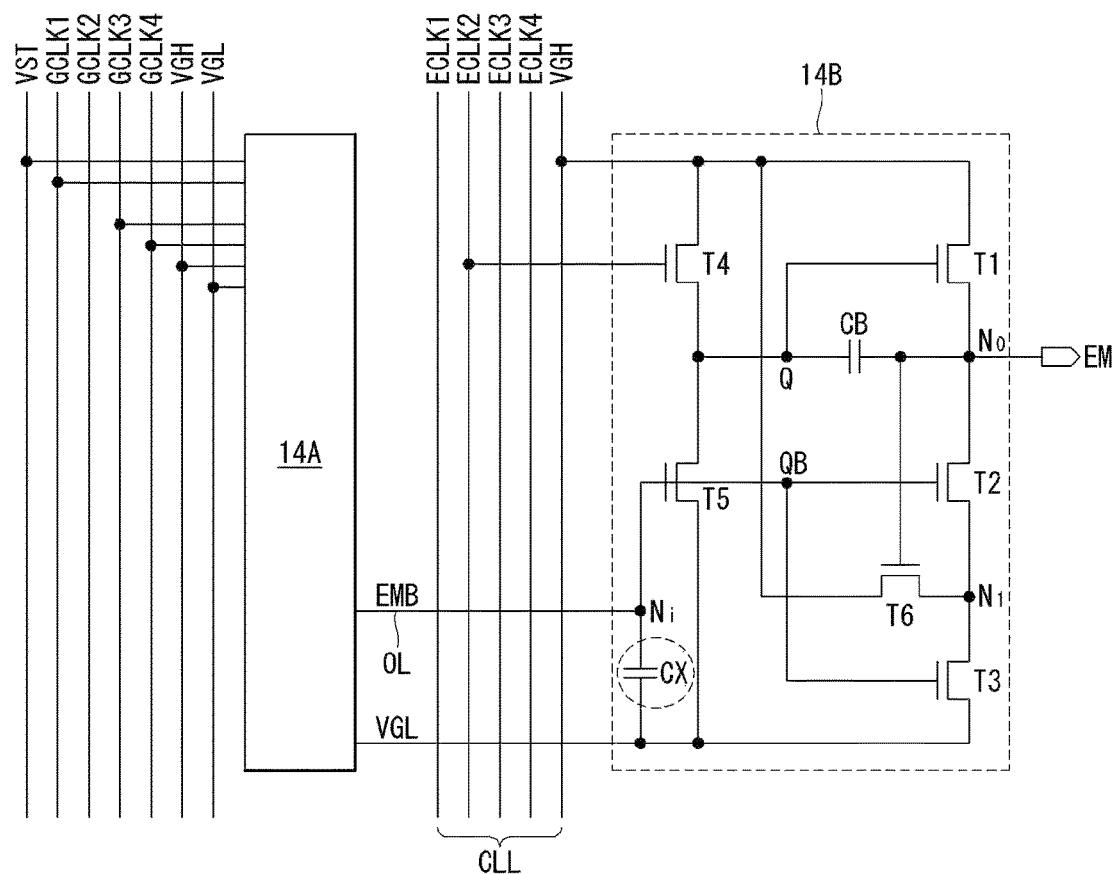
FIG. 11 illustrate an example in which an inverter further includes a ripple suppression capacitor, as another method for minimizing changes in a voltage of an emission control signal.

FIG. 11 illustrates an example in which an inverter of an emission driver further includes a ripple suppression capacitor, as another method for minimizing changes in a voltage of an EM signal.

With reference to the example of FIG. 11, an $i^{th}$ shift register 14A of the emission driver 14 may be connected to an input node Ni of an $i^{th}$ inverter 14B of the emission driver 14 through an output line OL, and may supply an anti-phase EM signal EMB to the $i^{th}$ inverter 14B, where "i" is a positive integer.

The $i^{th}$ shift register 14A may receive a gate start pulse VST, some (for example, GCLK1, GCLK3, and GCLK4) of gate shift clocks GCLK1 to GCLK4, a gate high voltage VGH, and a gate low voltage VGL, and may generate an anti-phase EM signal EMB shown in the FIG. 12 example. Because the $i^{th}$ shift register 14A can be implemented as any one of known shift registers, a detailed description thereof may be briefly made.

The $i^{th}$ inverter 14B may include a plurality of switches T1, T2, T3, T4, T5, and T6 and a boosting capacitor CB to output an EM signal EM by inverting a phase of the anti-phase EM signal EMB. In particular, the $i^{th}$ inverter 14B may further include a ripple suppression capacitor CX to suppress a ripple that is mixed in the anti-phase EM signal EMB due to an overlap between the output lines OL and emission shift clock lines CLL. Configuration of the switches of the $i^{th}$ inverter 14B may vary. The switches T1, T2, T3, T4, T5, and T6 may be implemented as n-type transistors, but are not limited thereto.

The first switch T1 may include a gate electrode connected to a Q node (e.g., a storage node), a drain electrode connected to an input terminal of the gate high voltage VGH, and a source electrode connected to an output node $N_O$. The second switch T2 may include a gate electrode connected to a QB node (e.g., a first intermediate node), a drain electrode connected to the output node $N_O$, and a source electrode connected to a first node $N_1$ (e.g., a second intermediate node). The third switch T3 may include a gate electrode connected to the QB node, a drain electrode connected to the first node $N_1$, and a source electrode connected to an input terminal of the gate low voltage VGL. The fourth switch T4 may include a gate electrode connected to an input terminal of one (for example, ECLK2) of the emission shift clocks ECLKs, a drain electrode connected to the input terminal of the gate high voltage VGH, and a source electrode connected to the Q node. The fifth switch T5 may include a gate electrode connected to an input node $N_i$, a drain electrode connected to the Q node, and a source electrode connected to the input terminal of the gate low voltage VGL. The sixth switch T6 may include a gate electrode connected to the output node $N_O$, a drain electrode connected to the input terminal of the gate high voltage VGH, and a source electrode connected to the first node $N_1$. Each of the fourth, fifth, and sixth switches T4, T5, and T6 may have a dual gate structure to improve an off-characteristic.

When the anti-phase EM signal EMB is input at a high level H, the fifth switch T5 may charge the Q node with the gate low voltage VGL. In one example, the second and third switches T2 and T3 may be turned on in response to the anti-phase EM signal EMB of the high level H, and may apply the gate low voltage VGL to the output node $N_O$. As a result, when the anti-phase EM signal EMB is input at the high level H, the EM signal EM may be output at a low level L.

When the anti-phase EM signal EMB is input at a low level L, the second and fifth switches T2 and T5 may be turned off, and the fourth switch T4 may be turned on in response to the emission shift clock ECLK2, and may charge the Q node with the gate high voltage VGH. In one example, the first switch T1 may be turned on based on a voltage of the Q node charged with the gate high voltage VGH, and the third switch T3 may be turned off based on a voltage of the QB node of the low level L. As a result, when the anti-phase EM signal EMB is input at the low level L, the EM signal EM may be output at a high level H. When the EM signal EM is output at the high level H, the sixth switch T6 may be turned on, and may apply the gate high voltage VGH to the first node $N_1$. Hence, because a gate-to-source voltage of the second switch T2 may be less than a threshold voltage of the second switch T2, the off-characteristic of the second switch T2 can be improved.

The ripple suppression capacitor CX may be connected between the input node $N_i$ connected to the output line OL of the shift register 14A and the input terminal of the gate low voltage VGL, thereby suppressing the ripple mixed in the anti-phase EM signal EMB input from the shift register 14A. The ripple loaded on the anti-phase EM signal EMB may be discharged to the gate low voltage VGL through the ripple suppression capacitor CX. As shown in the example of FIG. 12, changes in a voltage of the EM signal EM output from the inverter 14B can be minimized by minimizing the magnitude of the ripple, and the EM signal EM can be held at a stable high level during the data holding period.

One method illustrated in the examples of FIGS. 8 to 10 and another method illustrated in FIG. 11 may be simultaneously applied to minimize changes in a voltage of the EM signal. When the above two methods are simultaneously applied, an influence of the ripple can be further suppressed.

Embodiments may include a method for comparing the amplitudes of the gate shift clock and the emission shift clock applied to the emission driver 14 in the low-speed driving mode. Thus, it can be determined whether or not an embodiment is used through the comparison method. Further, the emission driver 14 according to an embodiment may have a circuit configuration including the ripple suppression capacitor CX. Thus, it can be determined whether or not an embodiment is used through the circuit configuration of the emission driver 14.

The display device according to an embodiment may include a TFT array substrate including signal lines or wires, such as data lines and scan lines (or gate lines), pixel electrodes, and TFTs. The TFT array substrate may include first TFTs disposed in a first area on a glass substrate and second TFTs disposed in a second area on the glass substrate. Semiconductor materials of the first and second TFTs may be different from each other, although embodiments are not limited thereto.

The display panel may include a display area and a non-display area. A plurality of pixels may be arranged in a matrix in the display area. In a pixel area, driving elements for driving the pixels and/or switching elements may be disposed. The non-display area may be disposed around the display area, and may have driving circuits for driving the pixels. The first area may be a portion of the non-display area, and the second region may be a portion of the display area. In this case, the first TFT and the second TFT may be spaced apart from each other, or both the first and second areas may be included in the display area. For example, when a single pixel includes a plurality of TFTs, the first TFT and the second TFT may be disposed adjacent to each other. The first TFT may be a TFT that uses polycrystalline semiconductor material as a semiconductor channel layer. The second TFT may be a TFT that uses oxide semiconductor material as a semiconductor channel layer. Embodiments are not limited to these examples.

The polycrystalline semiconductor material may be used for the driving circuits for driving the pixels because it has low energy power consumption and excellent reliability owing to its high mobility (e.g., 100 $cm^2/Vs$ or above). Moreover, the polycrystalline semiconductor material may be used for the driving TFTs of the pixels in an OLED display.

The oxide semiconductor material may be suitable for switching TFTs having a short on-time and a long off-time because of its low off-current. Moreover, the oxide semiconductor material may be suitable for display devices requiring the low-speed drive and/or the low power consumption by an increase in a voltage hold time of the pixel resulting from a low off-current of the oxide semiconductor material. An optimum TFT array substrate can be implemented by disposing two different types of TFTs on the same substrate as discussed above.

Figure 13:
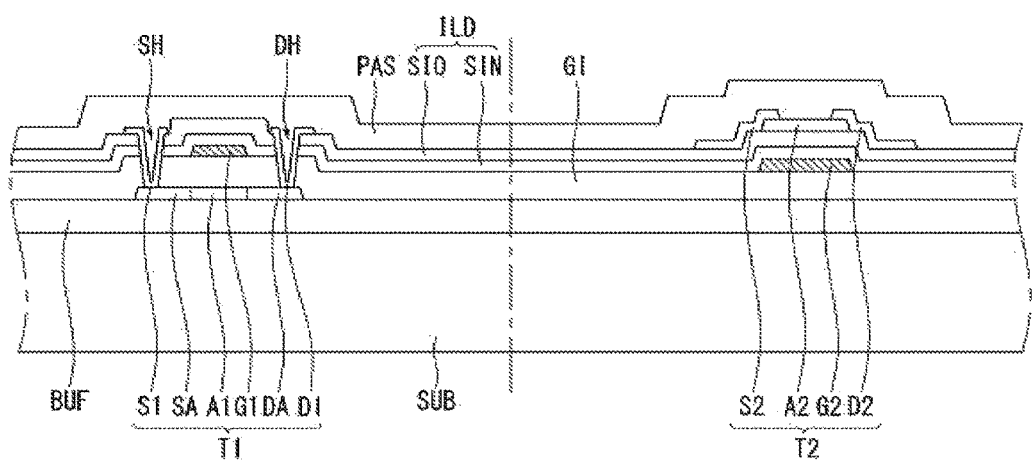
FIG. 13 is a cross-sectional view illustrating a structure of a TFT array substrate according to a first example embodiment.

When a semiconductor layer is made of a polycrystalline semiconductor material, an impurity injection process and a high-temperature thermal process may be performed. On the other hand, when the semiconductor layer is made of an oxide semiconductor material, the processes may be performed at a relatively low temperature. Thus, a polycrystalline semiconductor layer, which may undergo severe conditions, may be formed, and then an oxide semiconductor layer may be formed. To this end, as shown in the example of FIG. 13, a low temperature polycrystalline silicon (LTPS) TFT may have a top-gate structure, and an oxide TFTs may have a bottom-gate structure.

In a manufacturing process of the display device, because characteristics of the polycrystalline semiconductor material may be degraded if it has vacancies, a process for filling the vacancies with hydrogen by a hydrogenation process may be desirable. On the other hand, because vacancies that are not covalently bonded in the oxide semiconductor material can serve as carriers, a process for stabilizing the oxide semiconductor material while occupying the vacancies may be desirable. The two processes may be performed through a subsequent thermal process at 350° C. to 380° C.

To perform the hydrogenation process, a nitride layer including a large amount of hydrogen particles may be disposed on the polycrystalline semiconductor material. Because a material used to form the nitride layer contains a large amount of hydrogen, the nitride layer itself may contain a considerable amount of hydrogen. Hydrogen atoms may be diffused into the polycrystalline semiconductor material through the thermal process. As a result, the polycrystalline semiconductor layer may be stabilized. During the thermal process, an excessive amount of hydrogen may not be diffused into the oxide semiconductor material. Thus, an oxide layer may be disposed between the nitride layer and the oxide semiconductor material. After the thermal process is performed, the oxide semiconductor material may maintain a state in which it is affected too much by hydrogen, thereby achieving the device stabilization.

For convenience of explanation, in the following examples, the first TFT is a TFT used as a driving element formed in the non-display area and the second TFT is a TFT used as a switching element disposed in a pixel area of the display area. However, embodiments are not limited to this. For example, in an OLED display, both the first TFT and the second TFT may be disposed in a pixel area of the display area. In one example, a first TFT including a polycrystalline semiconductor material may be applicable to a driving TFT, and a second TFT including an oxide semiconductor material may be applicable to a switching TFT.

FIG. 13 is a cross-sectional view illustrating a structure of a TFT array substrate according to a first example embodiment.

With reference to the example of FIG. 13, a TFT array substrate may include a first TFT T1 and a second TFT T2 on a substrate SUB. The first and second TFTs T1 and T2 may be spaced apart from each other, may be disposed adjacent to each other, or may overlap each other.

A buffer layer BUF may be stacked on the entire surface of the substrate SUB. The buffer layer BUF may be omitted in some embodiments. In some embodiments, the buffer layer BUF may have a stacked structure of a plurality of thin film layers or a single layer. For convenience of explanation, the buffer layer BUF is illustrated in the example embodiments as a single layer example. A light shielding layer may be optionally provided only in a desired portion between the buffer layer BUF and the substrate SUB. The light shielding layer may prevent external light from coming into a semiconductor layer of a TFT disposed on the light shielding layer.

A first semiconductor layer A1 may be disposed on the buffer layer BUF. The first semiconductor layer A1 may include a channel region of the first TFT T1. The channel region may be defined as an overlap portion of a first gate electrode G1 and the first semiconductor layer A1. As the first gate electrode G1 overlaps a center portion of the first TFT T1, the center portion of the first TFT T1 may become the channel region. Both sides of the channel region may be regions doped with impurities, which are defined as a source region SA and a drain region DA.

The first TFT T1 may be implemented as a p-type MOSFET TFT or as an n-type MOSFET TFT, or as a complementary MOSFET (CMOS). The semiconductor material of the first TFT T1 may be a polycrystalline semiconductor material, such as polycrystalline silicon. The first TFT T1 may have a top-gate structure. Embodiments are not limited to these examples.

A gate insulating layer GI may be stacked on the entire surface of the substrate SUB on which the first semiconductor layer A1 is disposed. The gate insulating layer GI may be made of, e.g., silicon nitride ($SiN_x$) or silicon oxide ($SiO_x$). The gate insulating layer GI may have a thickness of, e.g., about 1,000 to 1,500 Å in consideration of stability and characteristics of the element. The gate insulating layer GI made of silicon nitride ($SiN_x$) may contain a large amount of hydrogen due to its manufacturing process. The hydrogen atoms may diffuse out of the gate insulating layer GI in a subsequent process. Thus, the gate insulating layer GI may be made of a silicon oxide ($SiO_x$) material.

The hydrogen diffusion may have a positive effect on the first semiconductor layer A1 including a polycrystalline silicon material. However, the hydrogen diffusion may have a negative effect on the second TFT T2 that may have different properties from the first TFT T1. In another embodiment, the gate insulating layer GI may be made thick, e.g., about 2,000 to 4,000 Å, unlike that described in the first example embodiment. If the gate insulating layer GI is made of silicon nitride ($SiN_x$), too much hydrogen may be diffused. Therefore, taking multiple factors into consideration, the gate insulating layer GI may be made of silicon oxide ($SiO_x$).

The first gate electrode G1 and a second gate electrode G2 may be disposed on the gate insulating layer GI. The first gate electrode G1 may overlap the center of the first semiconductor layer A1. The second gate electrode G2 may be disposed in a portion of the second TFT T2. In an example in which the first gate electrode G1 and the second gate electrode G2 are made of the same material on the same layer using the same mask, the manufacturing process can be simplified.

An interlayer dielectric layer ILD may be formed to cover the first and second gate electrodes G1 and G2. For example, FIG. 13 illustrates that the interlayer dielectric layer ILD may have a multilayered structure in which a nitride layer SIN including silicon nitride ($SiN_x$) and an oxide layer SIO including silicon oxide ($SiO_x$) are alternately stacked. For convenience of explanation, the illustrated examples of the interlayer dielectric layer ILD may have a simplified illustration, e.g., a two-layered structure in which an oxide layer SIO is stacked over a nitride layer SIN.

The nitride layer SIN may be provided to hydrogenate the first semiconductor layer A1 including polycrystalline silicon by diffusing the hydrogen included in the nitride layer SIN through a subsequent thermal process. On the other hand, the oxide layer SIO may be provided to prevent too much hydrogen, that is released from the nitride layer SIN due to the subsequent thermal process, from being diffused into the semiconductor material of the second TFT T2.

For example, the hydrogen released from the nitride layer SIN may diffuse into the first semiconductor layer A1, which may be disposed lower in the stack than the oxide layer SIO, with the gate insulating layer GI interposed between them. Accordingly, the nitride layer SIN may be disposed on the gate insulating layer GI, close to the first semiconductor layer A1. On the other hand, too much hydrogen released from the nitride layer SIN can be prevented from being diffused into the semiconductor material of the second TFT T2 disposed on the nitride layer SIN. Thus, the oxide layer SIO may be formed on the nitride layer SIN. When considering the manufacturing process, a total thickness of the interlayer dielectric layer ILD may be, e.g., about 2,000 Å to 6,000 Å. The nitride layer SIN and the oxide layer SIO each may have a thickness of, e.g., about 1,000 Å to 3,000 Å. Also, for the hydrogen in the nitride layer SIN to exert as little effect as possible on a second semiconductor layer A2 while diffusing in abundance into the first semiconductor layer A1, the thickness of the oxide layer SIO may be greater than the thickness of the gate insulating layer GI. For example, because the oxide layer SIO may be used for adjusting a degree of diffusion of hydrogen released from the nitride layer SIN, the oxide layer SIO may be made thicker than the nitride layer.

The second semiconductor layer A2 overlapping the second gate electrode G2 may be disposed on the oxide layer SIO of the interlayer dielectric layer ILD. The semiconductor layer A2 may include a channel region of the second TFT T2. The second semiconductor layer A2 may include an oxide semiconductor material, such as indium gallium zinc oxide (IGZO), indium gallium oxide (IGO), and/or indium zinc oxide (IZO). The oxide semiconductor material may be suitable for display devices requiring a low-speed drive and/or low power consumption by an increase in a voltage hold time of the pixel resulting from a low off-current characteristic of the oxide semiconductor material. The "off-current" refers, for example, to a leakage current flowing through a channel of a transistor when the transistor is in an off state.

Source and drain electrodes may be disposed on the semiconductor layer A2 and the interlayer dielectric layer ILD. A first source electrode S1 and a first drain electrode D1 may be spaced apart from each other at a predetermined distance while facing each other, with the first gate electrode G1 interposed between them. The first source electrode S1 may be connected to a source region SA, which may correspond to one side of the first semiconductor layer A1 exposed through a source contact hole SH. The source contact hole SH may penetrate the interlayer dielectric layer ILD and the gate insulating layer GI, and may expose the source region SA corresponding to one side of the first semiconductor layer A1. The first drain electrode D1 may be connected to a drain region DA, which may correspond to the other side of the first semiconductor layer A1 exposed through a drain contact hole DH. The drain contact hole DH may penetrate the interlayer dielectric layer ILD and the gate insulating layer GI, and may expose the drain region DA corresponding to the other side of the first semiconductor layer A1.

A second source electrode S2 and a second drain electrode D2 may directly contact upper surfaces of one side and the other side of the second semiconductor layer A2, respectively, and may be spaced apart from each other by a predetermined distance. The second source electrode S2 may be disposed to directly contact an upper surface of the interlayer dielectric layer ILD and an upper surface of one side of the semiconductor layer A2. The second drain electrode D2 may be disposed to directly contact an upper surface of the interlayer dielectric layer ILD and an upper surface of the other side of the second semiconductor layer A2.

The first TFT T1 and the second TFT T2 may be covered with a passivation layer PAS. Afterwards, the passivation layer PAS may be patterned to form more contact holes exposing the first drain electrode D1 and/or the second drain electrode D2. Moreover, a pixel electrode that may contact the first drain electrode D1 and/or the second drain electrode D2 via the contact holes may be formed on the passivation layer PAS. Here, for convenience, a simplified structure is described and illustrated.

As described above, the TFT array substrate for a flat panel display according to the first example embodiment may have a structure in which the first TFT T1 including a polycrystalline semiconductor material and the second TFT T2 including an oxide semiconductor material are formed on the same substrate SUB. For example, the first gate electrode G1 constituting the first TFT T1 and the second gate electrode G2 constituting the second TFT T2 may be formed on the same layer using the same material, although embodiments are not limited thereto.

The first semiconductor layer A1 including the polycrystalline semiconductor material of the first TFT T1 may be disposed under the first gate electrode G1, and the second semiconductor layer A2 including the oxide semiconductor material of the second TFT T2 may be disposed on the second gate electrode G2. Thus, an embodiment may have a structure that can prevent the oxide semiconductor material from being exposed at a high temperature during the manufacturing process by forming the first semiconductor layer A1 at a relatively high temperature, and then forming the second semiconductor layer A2 at a relatively low temperature. Accordingly, the first TFT T1 may have a top-gate structure because the first semiconductor layer A1 may be formed earlier than the first gate electrode G1. The second TFT T2 may have a bottom-gate structure because the second semiconductor layer A2 may be formed later than the second gate electrode G2.

A hydrogenation process of the first semiconductor layer A1 including the polycrystalline semiconductor material may be performed simultaneously with a thermal process of the second semiconductor layer A2 including the oxide semiconductor material. To this end, the interlayer dielectric layer ILD may have a structure in which the oxide layer SIO is stacked on the nitride layer SIN. Because of characteristic of the manufacturing process, the hydrogenation process may diffuse the hydrogen contained in the nitride layer SIN into the first semiconductor layer A1 through the thermal process. Moreover, the thermal process may stabilize the second semiconductor layer A2 including the oxide semiconductor material. The hydrogenation process may be performed after stacking the interlayer dielectric layer ILD on the first semiconductor layer A1, and the thermal process may be formed after forming the second semiconductor layer A2. According to the first embodiment, the oxide layer SIO stacked on the nitride layer SIN and under the second semiconductor layer A2 may prevent too much hydrogen contained in the nitride layer SIN from being diffused into the second semiconductor layer A2 including the oxide semiconductor material. Thus, the hydrogenation process may be performed simultaneously with the thermal process for stabilizing the oxide semiconductor material.

Figure 14:
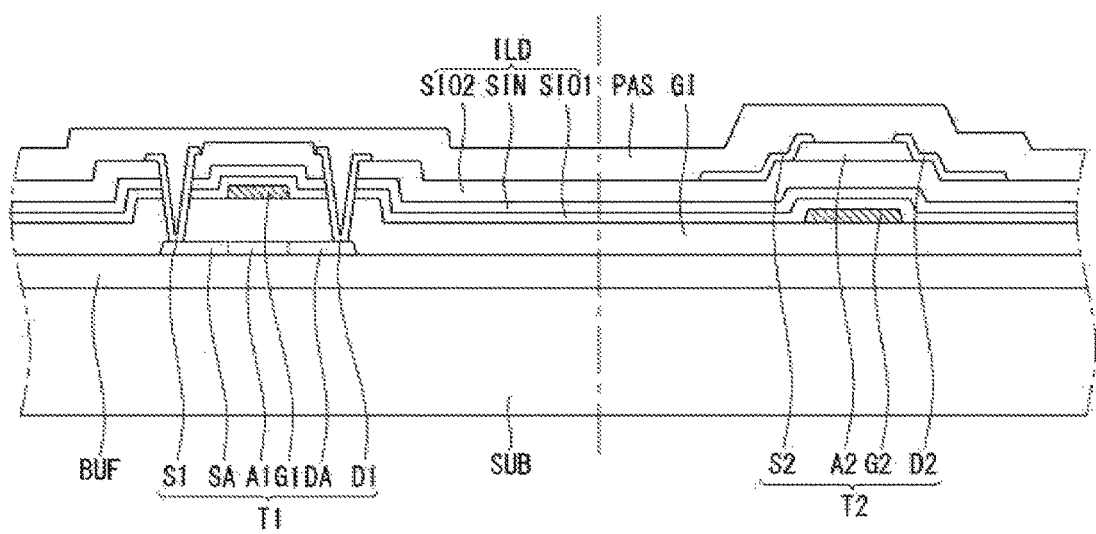
FIG. 14 is a cross-sectional view illustrating a structure of a TFT array substrate according to a second example embodiment.

FIG. 14 is a cross-sectional view illustrating a structure of a TFT array substrate according to a second example embodiment.

With reference to the FIG. 14 example, the second example embodiment is substantially similar to the first example embodiment, except that an interlayer dielectric layer ILD has a three-layer structure. For example, the interlayer dielectric layer ILD, may have a lower oxide layer SIO1, a nitride layer SIN, and an upper oxide layer SIO2 may be stacked.

The interlayer dielectric layer ILD may function as a gate insulating layer in the second TFT T2. Thus, if the interlayer dielectric layer ILD is too thick, the data voltage may not be transferred properly to a second semiconductor layer A2. Accordingly, the interlayer dielectric layer ILD may have a thickness of, e.g., about 2,000 Å to 6,000 Å.

Through a subsequent thermal process, hydrogen may be diffused into a first semiconductor layer A1 from the nitride layer SIN that may contain a large amount of hydrogen due to its manufacturing process. Considering diffusion efficiency, the lower oxide layer SIO1 may have a thickness of, e.g., about 500 Å to 1,000 Å, and the nitride layer SIN may have a thickness of, e.g., about 1,000 Å to 2,000 Å. Because the upper oxide layer SIO2 may limit the diffusion of hydrogen into the second semiconductor layer A2, the upper oxide layer SIO2 may have a thickness of, e.g., about 1,000 Å to 3,000 Å. For example, the upper oxide layer SIO2 may adjust a degree of diffusion of hydrogen released from the nitride layer SIN, and may be made thicker than the nitride layer SIN.

Figure 15:
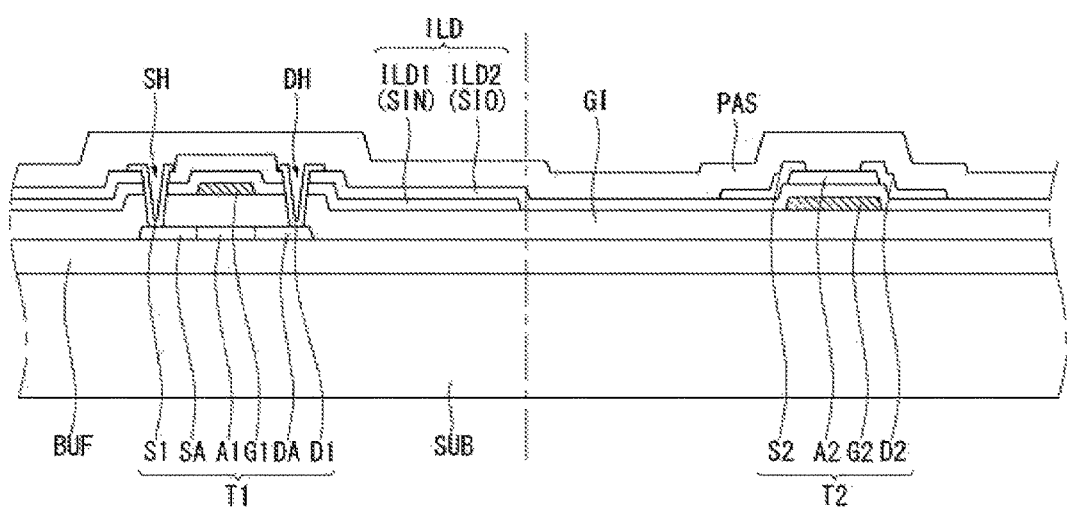
FIG. 15 is a cross-sectional view illustrating a structure of a TFT array substrate according to a third example embodiment.

FIG. 15 is a cross-sectional view illustrating a structure of a TFT array substrate according to a third example embodiment.

With reference to the example of FIG. 15, a TFT array substrate may include a first TFT T1 and a second TFT T2 on a substrate SUB. The first and second TFTs T1 and T2 may be spaced apart from each other, may be disposed adjacent to each other, or may overlap each other.

A buffer layer BUF may be stacked over the entire surface of a substrate SUB. The buffer layer BUF may be omitted in some embodiments. In some embodiments, the buffer layer BUF may have a stacked structure of a plurality of thin film layers or a single layer. For convenience of explanation, the buffer layer BUF is illustrated as a single layer example. A light shielding layer may be optionally provided only in a desired portion between the buffer layer BUF and the substrate SUB. The light shielding layer may prevent external light from coming into a semiconductor layer of a TFT disposed on the light shielding layer.

A first semiconductor layer A1 may be disposed on the buffer layer BUF. The first semiconductor layer A1 may include a channel region of the first TFT T1. The channel region may be defined as an overlap portion of a first gate electrode G1 and the first semiconductor layer A1. As the first gate electrode G1 may overlap a center portion of the first TFT T1, the center portion of the first TFT T1 may become the channel region. Both sides of the channel region may be doped with impurities, and are defined as a source region SA and a drain region DA.

The first TFT T1 may be implemented as a p-type MOSFET TFT or as an n-type MOSFET TFT, or as a complementary MOSFET (CMOS). A semiconductor material of the first TFT T1 may be a polycrystalline semiconductor material, such as polycrystalline silicon. The first TFT T1 may have a top-gate structure. Embodiments are not limited to these examples.

A gate insulating layer GI may be stacked on the entire surface of the substrate SUB on which the first semiconductor layer A1 is disposed. The gate insulating layer GI may be made, e.g., of silicon nitride ($SiN_x$) or silicon oxide ($SiO_x$). The gate insulating layer GI may have a thickness of, e.g., about 1,000 Å to 1,500 Å in consideration of stability and characteristics of the element. The gate insulating layer GI made of silicon nitride ($SiN_x$) may contain a large amount of hydrogen due to its manufacturing process. The hydrogen atoms may diffuse out of the gate insulating layer GI in a subsequent process. Thus, the gate insulating layer GI may be made of a silicon oxide material.

The hydrogen diffusion may have a positive effect on the first semiconductor layer A1 including a polycrystalline silicon material. However, the hydrogen diffusion may have a negative effect on the second TFT T2 that may have different properties from the first TFT T1. In some embodiments, the gate insulating layer GI may be made thick, e.g., about 2,000 Å to 4,000 Å, unlike that described in the third example embodiment. If the gate insulating layer GI is made of silicon nitride ($SiN_x$), too much hydrogen may be diffused. So, taking multiple factors into consideration, the gate insulating layer GI may be made of silicon oxide ($SiO_x$).

The first gate electrode G1 and a second gate electrode G2 may be disposed on the gate insulating layer GI. The first gate electrode G1 may overlap the center of the first semiconductor layer A1. The second gate electrode G2 may be disposed in a portion of the second TFT T2. In an embodiment in which the first gate electrode G1 and the second gate electrode G2 may be made of the same material on the same layer by using the same mask, the manufacturing process can be simplified.

A first interlayer dielectric layer ILD1 may cover the first and second gate electrodes G1 and G2. The first interlayer dielectric layer ILD1 may selectively cover a first area in which the first TFT T1 is disposed, but may not cover a second area in which the second TFT T2 is disposed. The first interlayer dielectric layer ILD1 may be made of a nitride layer SIN including silicon nitride ($SiN_x$). The nitride layer SIN may be provided so that the hydrogen included in the nitride layer SIN may be diffused through a subsequent thermal process to hydrogenate the first semiconductor layer A1 including polycrystalline silicon.

A second interlayer dielectric layer ILD2 may be formed on the nitride layer SIN to cover the entire substrate SUB. The second interlayer dielectric layer IDL2 may be formed as an oxide layer SIO made of silicon oxide ($SiO_x$). Because the oxide layer SIO may have a structure completely covering the nitride layer SIN, the oxide layer SIO can prevent too much hydrogen, released from the nitride layer SIN through the subsequent thermal process, from being diffused into the semiconductor material of the second TFT T2.

The hydrogen released from the first interlayer dielectric layer ILD1 made of the nitride layer SIN may be diffused into the first semiconductor layer A1, which may be disposed with the gate insulating layer GI underlying the first interlayer dielectric layer ILD1 interposed between them. On the other hand, too much hydrogen released from the nitride layer SIN may be prevented from being diffused into the semiconductor material of the second TFT T2 formed on the nitride layer SIN. Thus, the nitride layer SIN may be stacked on the gate insulating layer GI, close to the first semiconductor layer A1. For example, the nitride layer SIN may selectively cover the first TFT T1 including the first semiconductor layer A1 and may not be disposed in an area in which the second TFT T2 including a second semiconductor layer A2 is disposed.

When considering the manufacturing process, a total thickness of the first and second interlayer dielectric layers ILD1 and ILD2 may be, e.g., about 2,000 Å to 6,000 Å. The first interlayer dielectric layer ILD1 and the second interlayer dielectric layer ILD2 may each have a thickness of, e.g., about 1,000 Å to 3,000 Å. Also, for the hydrogen in the first interlayer dielectric layer ILD1 to exert as little effect as possible on the second semiconductor layer A2 while diffusing in abundance into the first semiconductor layer A1, the oxide layer SIO corresponding to the second interlayer dielectric layer ILD2 may have a greater thickness than the gate insulating layer GI. Particularly, the oxide layer SIO corresponding to the second interlayer dielectric layer ILD2 may adjust a degree of diffusion of hydrogen released from the nitride layer SIN corresponding to the first interlayer dielectric layer ILD1, and the second interlayer dielectric layer ILD2 may be made thicker than the first interlayer dielectric layer ILD1.

The second semiconductor layer A2 overlapping the second gate electrode G2 may be disposed on the second interlayer dielectric layer ILD2. The semiconductor layer A2 may include a channel region of the second TFT T2. The semiconductor material of the second TFT T2 may include an oxide semiconductor material such as indium gallium zinc oxide (IGZO), indium gallium oxide (IGO), and/or indium zinc oxide (IZO). The oxide semiconductor material may be suitable for display devices requiring a low-speed drive and/or low power consumption by an increase in a voltage hold time of the pixel resulting from a low off-current characteristic of the oxide semiconductor material. The "off-current" refers to, e.g., a leakage current flowing through a channel of a transistor when the transistor is in an off state.

Source and drain electrodes may be disposed on the semiconductor layer A2 and the second interlayer dielectric layer ILD2. A first source electrode S1 and a first drain electrode D1 may be spaced apart from each other at a predetermined distance while facing each other, with the first gate electrode G1 interposed between them. The first source electrode S1 may be connected to a source region SA, which may correspond to one side of the first semiconductor layer A1 exposed through a source contact hole SH. The source contact hole SH may penetrate the first and second interlayer dielectric layers ILD1 and ILD2 and the gate insulating layer GI, and may expose the source region SA corresponding to the one side of the first semiconductor layer A1. The first drain electrode D1 may be connected to a drain region DA, which may correspond to the other side of the first semiconductor layer A1 exposed through a drain contact hole DH. The drain contact hole DH may penetrate the first and second interlayer dielectric layers ILD1 and ILD2 and the gate insulating layer GI, and may expose the drain region DA corresponding to the other side of the first semiconductor layer A1.

A second source electrode S2 and a second drain electrode D2 may respectively contact upper surfaces of one side and the other side of the second semiconductor layer A2, and may be spaced apart from each other by a predetermined distance. The second source electrode S2 may contact an upper surface of the second interlayer dielectric layer ILD2 and the upper surface of one side of the semiconductor layer A2. The second drain electrode D2 may contact the upper surface of the second interlayer dielectric layer ILD2 and the upper surface of the other side of the second semiconductor layer A2.

The first TFT T1 and the second TFT T2 may be covered with a passivation layer PAS. Afterwards, the passivation layer PAS may be patterned to form more contact holes exposing the first drain electrode D1 and/or the second drain electrode D2. Moreover, a pixel electrode may contact the first drain electrode D1 and/or the second drain electrode D2 via the contact holes. The pixel electrode may be on the passivation layer PAS. Here, a simplified structure is illustrated for convenience.

In the third example embodiment, the first TFT T1 and the second TFT T2 may be formed on the same substrate SUB. In the third example embodiment, the first gate electrode G1 of the first TFT T1 and the second gate electrode G2 of the second TFT T2 may be formed on the same layer using the same material. Embodiments are not limited thereto.

The first semiconductor layer A1 including the polycrystalline semiconductor material of the first TFT T1 may be under the first gate electrode G1, and the second semiconductor layer A2 including the oxide semiconductor material of the second TFT T2 may be on the second gate electrode G2. Thus, embodiments may prevent the oxide semiconductor material from being exposed at a high temperature during the manufacturing process by forming the first semiconductor layer A1 at a relatively high temperature, and then forming the second semiconductor layer A2 at a relatively low temperature. Accordingly, the first TFT T1 may have a top-gate structure because the first semiconductor layer A1 may be formed earlier than the first gate electrode G1. The second TFT T2 may have a bottom-gate structure because the second semiconductor layer A2 may be formed later than the second gate electrode G2.

A hydrogenation process of the first semiconductor layer A1 including the polycrystalline semiconductor material may be performed simultaneously with a thermal process of the second semiconductor layer A2 including the oxide semiconductor material. To this end, the first interlayer dielectric layer may have a structure in which the second interlayer dielectric layer ILD2 corresponding to the oxide layer SIO may be stacked on the first interlayer dielectric layer ILD1 corresponding to the nitride layer SIN. Because of characteristic of the manufacturing process, the hydrogenation process may diffuse the hydrogen contained in the first interlayer dielectric layer ILD1 corresponding to the nitride layer SIN into the first semiconductor layer A1 through the thermal process. Moreover, the thermal process may stabilize the second semiconductor layer A2 including the oxide semiconductor material. The hydrogenation process may be performed after stacking the interlayer dielectric layer ILD on the first semiconductor layer A1, and the thermal process may be formed after forming the second semiconductor layer A2.

Alternatively, the hydrogenation process may be performed after forming the first interlayer dielectric layer ILD1. The second interlayer dielectric layer ILD2 may prevent too much hydrogen, contained in the nitride layer SIN, from being diffused into the second semiconductor layer A2 including the oxide semiconductor material. Thus, embodiments may perform the hydrogenation process simultaneously with the thermal process for stabilizing the oxide semiconductor material.

The first interlayer dielectric layer ILD1 may be selectively formed in the first area, in which the first TFT T1 receiving the hydrogenation is disposed. Thus, the second TFT T2 including the oxide semiconductor material may be spaced a considerable distance apart from the nitride layer SIN. As a result, too much hydrogen contained in the nitride layer SIN can be prevented from being diffused into the second semiconductor layer A2 during the subsequent thermal process. Because the second interlayer dielectric layer ILD2 corresponding to the oxide layer SIO may be further deposited on the nitride layer SIN, too much hydrogen contained in the nitride layer SIN can be prevented from being diffused into the second semiconductor layer A2 including the oxide semiconductor material.

Figure 16:
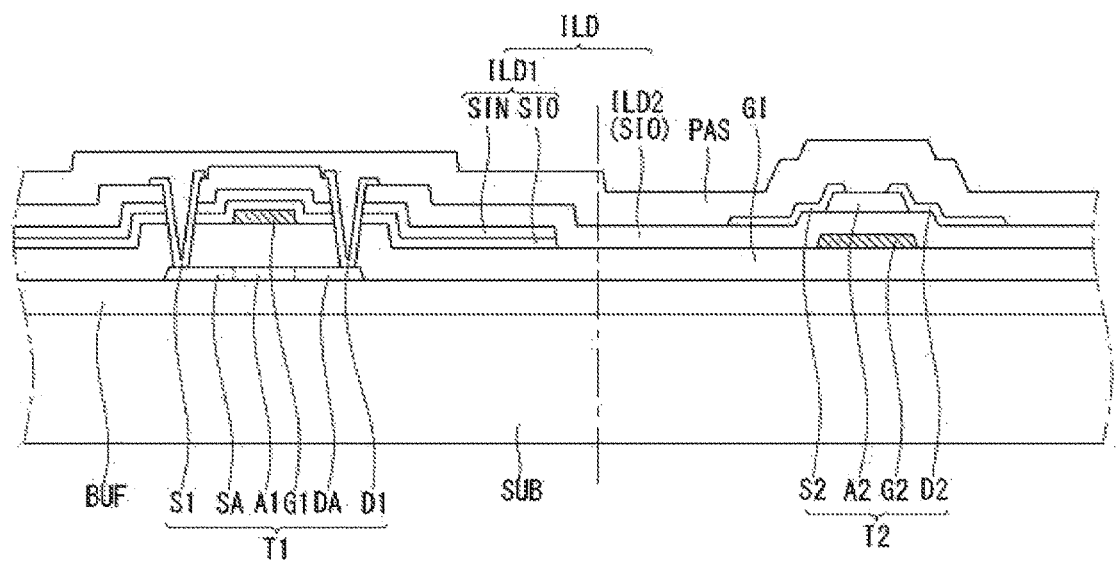
FIG. 16 is a cross-sectional view illustrating a structure of a TFT array substrate according to a fourth example embodiment.

FIG. 16 is a cross-sectional view illustrating a structure of a TFT array substrate according to a fourth example embodiment.

With reference to the example of FIG. 16, the fourth example embodiment is substantially similar to the third example embodiment, except that a first interlayer dielectric layer ILD1 may have a two-layer structure. For example, the first interlayer dielectric layer ILD1 may have a structure in which a nitride layer SIN is formed on an oxide layer SIO.

Through a subsequent thermal process, hydrogen may be diffused into a first semiconductor layer A1 from a nitride layer SIN that may contain a large amount of hydrogen due to its manufacturing process. With a diffusion degree of hydrogen taken into consideration, a thickness of the nitride layer SIN may be set to, e.g., about 1,000 Å to 3,000 Å. The oxide layer SIO of the first interlayer dielectric layer ILD1 may compensate for damage to the surface of the gate insulating layer GI caused during a process for forming gate electrodes G1 and G2, and may be made less thick, e.g., about 500 Å to 1,000 Å. The second interlayer dielectric layer ILD2 corresponding to the oxide layer SIO may adjust a diffusion degree of hydrogen released from the nitride layer SIN, and the second interlayer dielectric layer ILD2 may be made thicker than the nitride layer SIN.

A second interlayer dielectric layer ILD2 may be formed on the first interlayer dielectric layer ILD1. The first interlayer dielectric layer ILD1 may be selectively formed in an area where a first TFT T1 is formed, and the second interlayer dielectric layer ILD2 may cover the entire surface of a substrate SUB.

The second interlayer dielectric layer ILD2 may serve as a gate insulating layer of a second TFT T2. Thus, if the second interlayer dielectric layer ILD2 is too thick, a data voltage may not be transferred properly to the second semiconductor layer A2. Thus, the second interlayer dielectric layer ILD2 may have a thickness of, e.g., about 1,000 Å to 3,000 Å.

With this taken into consideration, the oxide layer SIO constituting the first interlayer dielectric layer ILD1 may have a thickness of, e.g., about 500 Å to 1,000 Å, and the nitride layer SIN constituting the first interlayer dielectric layer ILD1 may have a thickness of, e.g., about 1,000 Å to 3,000 Å. The second interlayer dielectric layer ILD2 may have a thickness of, e.g., about 1,000 Å to 3,000 Å. The gate insulating layer GI may have a thickness of, e.g., about 1,000 Å to 1,500 Å.

Figure 17:
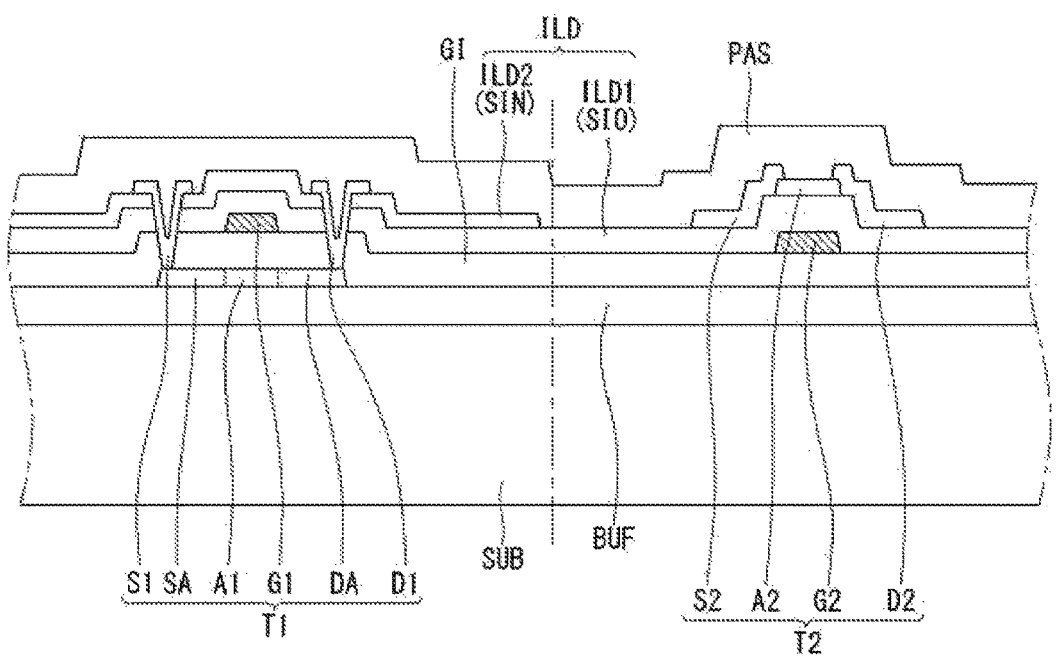
FIG. 17 is a cross-sectional view illustrating a structure of a TFT array substrate according to a fifth example embodiment.

FIG. 17 is a cross-sectional view illustrating a structure of a TFT array substrate according to a fifth example embodiment.

With reference to the example of FIG. 17, the fifth example embodiment is substantially similar to the third and fourth example embodiments, except that a first interlayer dielectric layer ILD1 may include an oxide layer SIO and a second interlayer dielectric layer ILD2 may include a nitride layer SIN. The second interlayer dielectric layer ILD2 made of the nitride layer SIN may be selectively disposed in a first area in which the first TFT T1 is disposed, but not in a second area region in which the second TFT T2 is disposed.

The first interlayer dielectric layer ILD1 may be interposed between a second gate electrode G2 and a second semiconductor layer A2, and may function as a gate insulating layer of the second TFT T2. Thus, the first interlayer dielectric layer ILD1 may be made of the oxide layer SIO that does not release hydrogen during a subsequent thermal process. Because the second source and drain electrodes S2 and D2 are disposed on the first interlayer dielectric layer ILD1, sufficient insulation for the first interlayer dielectric layer ILD1 and the second gate insulation G2 may be desirable. Accordingly, the first interlayer dielectric layer ILD1 may have a thickness of, e.g., 1,000 to 3,000 Å.

By forming the nitride layer SIN on the first interlayer dielectric layer ILD1 in an area in which the first TFT T1 is disposed, hydrogen contained in the nitride layer SIN may need to be diffused into a first semiconductor layer A1 through a subsequent thermal process. The first interlayer dielectric layer ILD1 may be relatively thick—enough to function as the gate insulating layer. Thus, the nitride layer SIN may have a sufficient thickness, for example, about 1,000 Å to 3,000 Å, so that hydrogen passes through the first interlayer dielectric layer ILD1 and is diffused into the first semiconductor layer A1.

Even if the nitride layer SIN has the thickness of, e.g., about 1,000 Å to 3,000 Å, the nitride layer SIN may be spaced a considerable distance apart from the second TFT T2. Therefore, the possibility that hydrogen in the nitride layer SIN will be diffused into the second semiconductor layer A2 may be remarkably low. Moreover, although the second semiconductor layer A2 may be stacked on the first interlayer dielectric layer ILD1 in the fifth example embodiment, the TFT array substrate can be kept stable because the first interlayer dielectric layer ILD1 may be the oxide layer SIO.

Figure 18A:
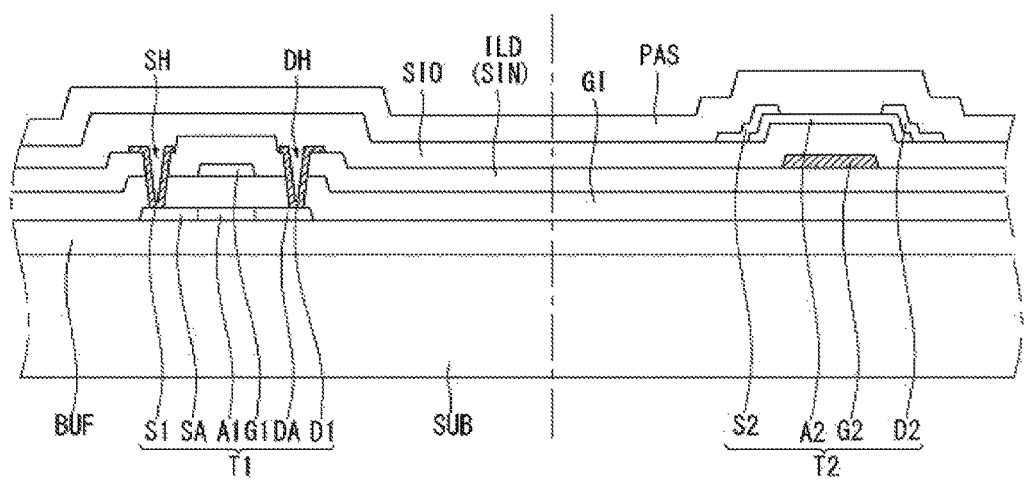
FIGS. 18A and 18B are cross-sectional views illustrating a structure of a TFT array substrate according to a sixth example embodiment.
Figure 18B:
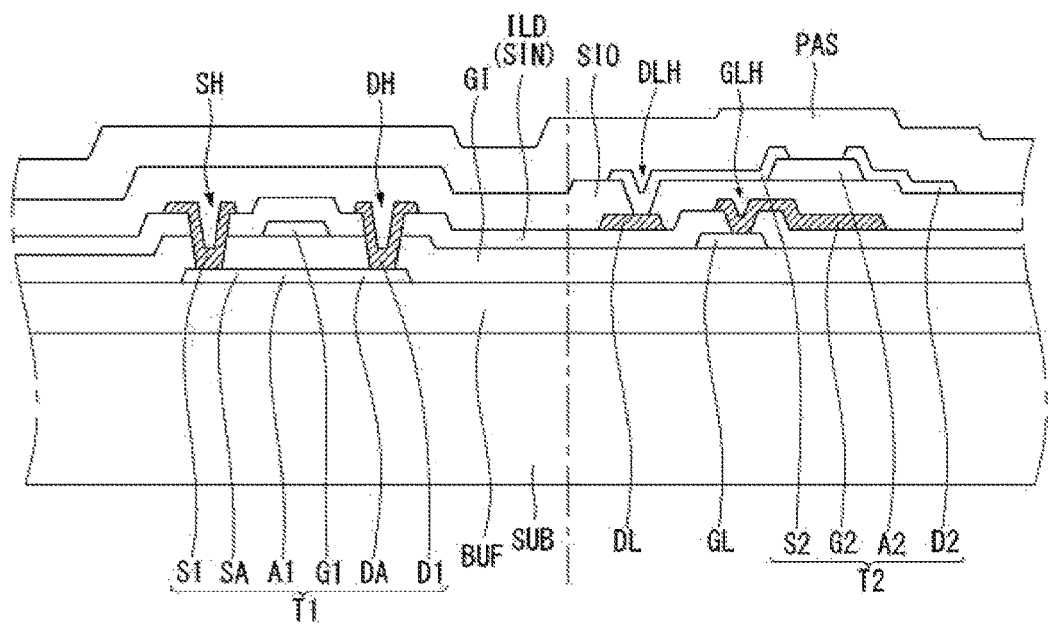

FIGS. 18A and 18B are cross-sectional views illustrating a structure of a TFT array substrate according to a sixth example embodiment.

With reference to the example of FIG. 18A, a TFT array substrate may include a first TFT T1 and a second TFT T2 on a substrate SUB. The first and second TFTs T1 and T2 may be spaced apart from each other, may be disposed adjacent to each other, or may overlap each other.

A buffer layer BUF may be stacked over the entire surface of a substrate SUB. The buffer layer BUF may be omitted in some embodiments. In some embodiments, the buffer layer BUF may have a stacked structure of a plurality of thin film layers or a single layer. For convenience of explanation, the buffer layer BUF is illustrated as a single layer example. A light shielding layer may be optionally provided only in a desired portion between the buffer layer BUF and the substrate SUB. The light shielding layer may be formed to prevent external light from coming into a semiconductor layer of the TFTs over it.

A first semiconductor layer A1 may be disposed on the buffer layer BUF. The first semiconductor layer A1 may include a channel region of the first TFT T1. The channel region may be defined as an overlap portion of a first gate electrode G1 and the first semiconductor layer A1. As the first gate electrode G1 may overlap a center portion of the first TFT T1, the center portion of the first TFT T1 may become the channel region. Both sides of the channel region may be doped with impurities, and are defined as a source region SA and a drain region DA.

The first TFT T1 may be implemented as a p-type MOSFET TFT or as an n-type MOSFET TFT, or as a complementary MOSFET (CMOS). The semiconductor material of the first TFT T1 may be a polycrystalline semiconductor material, such as polycrystalline silicon. The first TFT T1 may have a top-gate structure. Embodiments are not limited to these examples.

A gate insulating layer GI may be stacked on the entire surface of the substrate SUB on which the first semiconductor layer A1 is disposed. The gate insulating layer GI may be made, e.g., of silicon nitride ($SiN_x$) or silicon oxide ($SiO_x$). The gate insulating layer GI may have a thickness of, e.g., about 1,000 Å to 1,500 Å in consideration of stability and characteristics of the element. The gate insulating layer GI made of silicon nitride ($SiN_x$) may contain a large amount of hydrogen due to its manufacturing process. The hydrogen atoms may diffuse out of the gate insulating layer GI in a subsequent process. Thus, the gate insulating layer GI may be made of a silicon oxide material.

The hydrogen diffusion may have a positive effect on the first semiconductor layer A1 including a polycrystalline silicon material. However, the hydrogen diffusion may have a negative effect on the second TFT T2 that may have different properties from the first TFT T1. In some embodiments, the gate insulating layer GI may be made thick, e.g., about 2,000 Å to 4,000 Å, unlike that described in the sixth example embodiment. If the gate insulating layer GI is made of silicon nitride ($SiN_x$), too much hydrogen may be diffused. So, taking multiple factors into consideration, the gate insulating layer GI may be made of silicon oxide ($SiO_x$).

The first gate electrode G1 may be disposed on the gate insulating layer GI. The first gate electrode G1 may overlap the center portion of the first semiconductor layer A1. The center portion of the first semiconductor layer A1 overlapping the first gate electrode G1 may be defined as a channel region.

An interlayer dielectric layer ILD may be stacked over the entire surface of the substrate SUB on which the first gate electrode G1 is formed. The interlayer dielectric layer ILD may be made of a nitride layer SIN including an inorganic nitride material such as silicon nitride ($SiN_x$). The nitride layer SIN may be deposited so that the hydrogen in the nitride layer SIN is diffused through a subsequent thermal process to hydrogenate the first semiconductor layer A1 including polycrystalline silicon.

A first source electrode S1, a first drain electrode D1, and a second gate electrode G2 may be disposed on the interlayer dielectric layer ILD. The first source electrode S1 may contact a source region SA, which may correspond to one side of the first semiconductor layer A1 via a source contact hole SH that penetrates the interlayer dielectric layer ILD and the gate insulating layer GI. The first drain electrode D1 may contact a drain region DA, which may correspond to the other side of the first semiconductor layer A1, via a drain contact hole DH that penetrates the interlayer dielectric layer ILD and the gate insulating layer GI. Meanwhile, the second gate electrode G2 may be disposed in a portion of the second TFT T2. In embodiments in which the first source electrode S1, the first drain electrode D1, and the second gate electrode G2 may be formed of the same material on the same layer by using the same mask, and the manufacturing process can be simplified.

An oxide layer SIO may be stacked on the interlayer dielectric layer ILD on which the first source electrode S1, first drain electrode D1, and second gate electrode G2 are formed. The oxide layer SIO may include an inorganic oxide material, such as silicon oxide ($SiO_x$). As the oxide layer SIO may be stacked on the nitride layer SIN, embodiments may prevent too much hydrogen, released from the nitride layer SIN due to the subsequent heat treatment, from diffusing into the semiconductor material of the second TFT T2.

The hydrogen released from the interlayer dielectric layer ILD made of the nitride layer SIN may be diffused into the first semiconductor layer A1, which may be lower in the stack than the interlayer dielectric layer ILD, with the gate insulating layer GI interposed between them. On the other hand, too much hydrogen released from the nitride layer SIN may be prevented from being diffused into the semiconductor material of the second TFT T2 on the nitride layer SIN. Accordingly, the nitride layer SIN may be stacked on the gate insulating layer GI, close to the first semiconductor layer A1. The nitride layer SIN may selectively cover the first TFT T1 including the first semiconductor layer A1, and may not be in an area in which the second TFT T2 is disposed.

When considering the manufacturing process and diffusion efficiency of hydrogen, the interlayer dielectric layer ILD made of the nitride layer SIN may have a thickness of, e.g., about 1,000 Å to 3,000 Å. For the hydrogen in the nitride layer SIN to exert as little effect as possible on the second semiconductor layer A2 while diffusing in abundance into the first semiconductor layer A1, the oxide layer SIO may be greater in thickness than the gate insulating layer GI. The oxide layer SIO may adjust a diffusion degree of hydrogen released from the nitride layer SIN, and the oxide layer SIO may be thicker than the nitride layer SIN. The oxide layer SIO may function as a gate insulating layer of the second TFT T2. With this taken into consideration, the oxide layer SIO may have a thickness of, e.g., about 1,000 Å to 3,000 Å, The second semiconductor layer A2 overlapping the second gate electrode G2 may be formed on an upper surface of the oxide layer SIO. The semiconductor layer A2 may include an oxide semiconductor material, such as indium gallium zinc oxide (IGZO), indium gallium oxide (IGO), and/or indium zinc oxide (IZO). The semiconductor layer A2 may be driven at a low frequency because of a characteristic of a low off-current of the oxide semiconductor material. Because the semiconductor layer A2 may be sufficiently driven at a low auxiliary capacitance owing to the low off-current characteristic, embodiments can reduce an area occupied by an auxiliary capacitor. Thus, the oxide semiconductor material may be beneficial when implementing a super-high resolution display device having a small unit pixel area. The second TFT T2 may have a bottom-gate structure.

A second source electrode S2 and a second drain electrode D2 may be disposed on the second semiconductor layer A2 and the oxide layer SIO. The second source electrode S2 and the second drain electrode D2 may contact an upper surface of one side and the other side of the second semiconductor layer A2, respectively, and may be spaced a predetermined distance apart from each other. The second source electrode S2 may contact an upper surface of the oxide layer SIO and the upper surface of the one side of the second semiconductor layer A2. The second drain electrode D2 may contact the upper surface of the oxide layer SIO and the upper surface of the other side of the second semiconductor layer A2.

The first TFT T1 and the second TFT T2 may be covered with a passivation layer PAS. Afterwards, the passivation layer PAS may be patterned to form more contact holes exposing the first drain electrode D1 and/or the second drain electrode D2. Moreover, a pixel electrode that contacts the first drain electrode D1 and/or the second drain electrode D2 via the contact holes may be formed on the passivation layer PAS. For convenience of explanation, a simplified structure is illustrated.

Embodiments may prevent the oxide semiconductor material from being exposed at a high temperature during the manufacturing process by forming the first semiconductor layer A1 at a relatively high temperature, and then forming the second semiconductor layer A2 at a relatively low temperature. Accordingly, the first TFT T1 may have a top-gate structure because the first semiconductor layer A1 may be formed earlier than the first gate electrode G1. The second TFT T2 may have a bottom-gate structure because the second semiconductor layer A2 may be formed later than the second gate electrode G2.

The first semiconductor layer A1 may be hydrogenated simultaneously with a thermal process of the second semiconductor layer A2. To this end, the interlayer dielectric layer ILD may be made of the nitride layer SIN, and the oxide layer SIO may be stacked on the interlayer dielectric layer ILD. Because of characteristic of the manufacturing process, a hydrogenation process may diffuse hydrogen contained in the nitride layer SIN into the first semiconductor layer A1 by the thermal process. Moreover, a thermal process may stabilize the second semiconductor layer A2 including the oxide semiconductor material. The hydrogenation process may be performed after stacking the interlayer dielectric layer ILD on the first semiconductor layer A1, and the thermal process may be formed after forming the second semiconductor layer A2. The oxide layer SIO deposited on the nitride layer SIN and under the second semiconductor layer A2 may prevent too much hydrogen, contained in the nitride layer SIN, from diffusing into the second semiconductor layer A2 including the oxide semiconductor material. Accordingly, the hydrogenation process may be performed simultaneously with the thermal process for stabilizing the oxide semiconductor material.

The nitride layer SIN may be formed on the first gate electrode G1 close to the first semiconductor layer A1 receiving the hydrogenation. The second TFT T2 including the oxide semiconductor material may be formed on the oxide layer SIO covering the nitride layer SIN and the second gate electrode G2 on the nitride layer SIN so that the second TFT T2 is spaced a considerable distance apart from the nitride layer SIN. As a result, too much hydrogen contained in the nitride layer SIN can be prevented from being diffused into the second semiconductor layer A2 during the subsequent thermal process.

When the second TFT T2 is used as a switching element disposed in a pixel area, signal lines such as the gate line and the data line may be disposed around the pixel area. The gate line and the data line may be formed on the same layer as the gate line and the data line of the first TFT T1. With reference to the FIG. 18B example, a further explanation will be given as to how the gate electrode and the source electrode of the second TFT T2 are respectively connected to the gate line and the data line.

As illustrated in FIG. 18B, when the first gate electrode G1 constituting the first TFT T1 is formed, a gate line GL may be formed around the second TFT T2 on the same layer using the same material, although embodiments are not limited thereto. The gate line GL may be covered by the interlayer dielectric layer ILD in the same manner as the first gate electrode G1.

A source contact hole SH opening the source region SA of the first semiconductor layer A1 and a drain contact hole DH exposing the drain region DA may be formed in the interlayer dielectric layer ILD. At the same time, a gate line contact hole GLH exposing a portion of the gate line GL may be further formed in the interlayer dielectric layer ILD.

The first source electrode S1, the first drain electrode D1, the second gate electrode G2, and the data line 24 may be formed on the interlayer dielectric layer ILD. The first source electrode S1 may contact the source region SA via the source contact hole SH. The first drain electrode D1 may contact the drain region DA via the drain contact hole DH. The second gate electrode G2 may be connected to the gate line GL via the gate line contact hole GLH. The data line 24 may be arranged near the second TFT T2 and may intersect the gate line GL, with the interlayer dielectric layer ILD interposed between them.

The first source electrode S1, the first drain electrode D1, and the second gate electrode G2 may be covered with the oxide layer SIO. The second semiconductor layer A2 overlapping the second gate electrode G2 may be disposed on the oxide layer SIO. A data line contact hole DLH exposing a portion of the data line 24 may be further formed on the oxide layer SIO.

The second source electrode S2 and the second drain electrode D2 may be disposed on the second semiconductor layer A2 and the oxide layer SIO. The second source electrode S2 may contact the upper surface of one side of the second semiconductor layer A1, and may be connected to the data line 24 via the data line contact hole DLH. The second drain electrode D2 may contact the upper surface of the other side of the second semiconductor layer A2.

Figure 19:
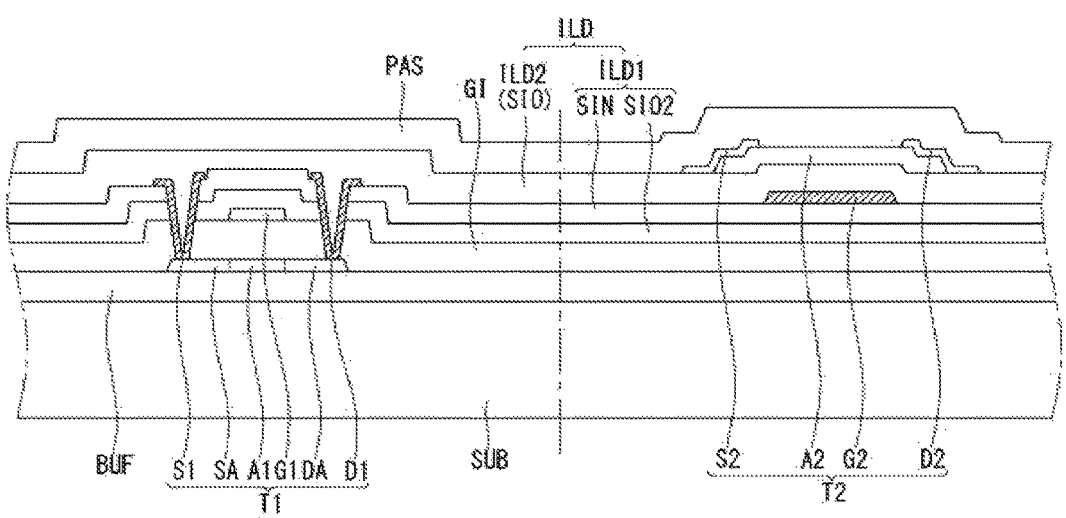
FIG. 19 is a cross-sectional view illustrating a structure of a TFT array substrate according to a seventh example embodiment.

FIG. 19 is a cross-sectional view illustrating a structure of a TFT array substrate according to a seventh example embodiment.

With reference to the example of FIG. 19, the seventh example embodiment is substantially similar to the sixth example embodiment, except that a first interlayer dielectric layer ILD1 may have a two-layer structure. For example, the first interlayer dielectric layer ILD1 may have a structure in which a lower oxide layer SIO2 and a nitride layer SIN are stacked. The nitride layer SIN may be formed on the lower oxide layer SIO2. Alternatively, the lower oxide layer SIO2 may be formed on the nitride layer SIN. As used herein, the term "lower" in the lower oxide layer SIO2 is not a restricted term that refers to an oxide layer under the nitride layer SIN, but refers to an oxide layer under the oxide layer SIO.

Through a subsequent thermal process, hydrogen may be diffused into a first semiconductor layer A1 from the nitride layer SIN that contains a large amount of hydrogen due to its manufacturing process. With diffusion efficiency taken into consideration, the nitride layer SIN of the first interlayer dielectric layer ILD1 may have a thickness of, e.g., about 1,000 Å to 3,000 Å. The lower oxide layer SIO2 may compensate for damage to the surface of the gate insulating layer GI caused during the process of forming a first gate electrode G1 or may stabilize the nitride layer SIN. The lower oxide layer SIO2 may have a thickness of, e.g., about 500 Å to 1,000 Å.

A second interlayer dielectric layer ILD2 made of an oxide layer SIO may be formed on the first interlayer dielectric layer ILD1 including the lower oxide layer SIO2 and the nitride layer SIN. The oxide layer SIO of the second interlayer dielectric layer ILD2 may functions as a gate insulating layer of the second TFT T2. Thus, if the oxide layer SIO is too thick, the data voltage may not be transferred properly to the second semiconductor layer A2. Thus, the oxide layer SIO may have a thickness of, e.g., about 1,000 Å to 3,000 Å. The gate insulating layer GI may have a thickness of, e.g., about 1,000 Å to 1,500 Å.

The first interlayer dielectric layer ILD1 may have a structure in which the lower oxide layer SIO2 may be formed on the nitride layer SIN. For example, the nitride layer SIN may be positioned closer to the first semiconductor layer A1 disposed under the nitride layer SIN, and may be spaced apart from the second semiconductor layer A2 on the nitride layer SIN by a thickness of the lower oxide layer SIO2. Thus, this may allow for better hydrogen diffusion into the first semiconductor layer A1 and better prevention of hydrogen diffusion into the second semiconductor layer A2.

When considering the manufacturing process, a total thickness of the first interlayer dielectric layer ILD1 may be, e.g., about 2,000 Å to 6,000 Å. The nitride layer SIN and the lower oxide layer SIO2 each may have a thickness of, e.g., about 1,000 Å to 3,000 Å. The oxide layer SIO of the second interlayer dielectric layer ILD2 may have a thickness of, e.g., about 1,000 Å to 3,000 Å, taking into consideration that the oxide layer SIO functions as the gate insulating layer of the second TFT T2.

Figure 20:
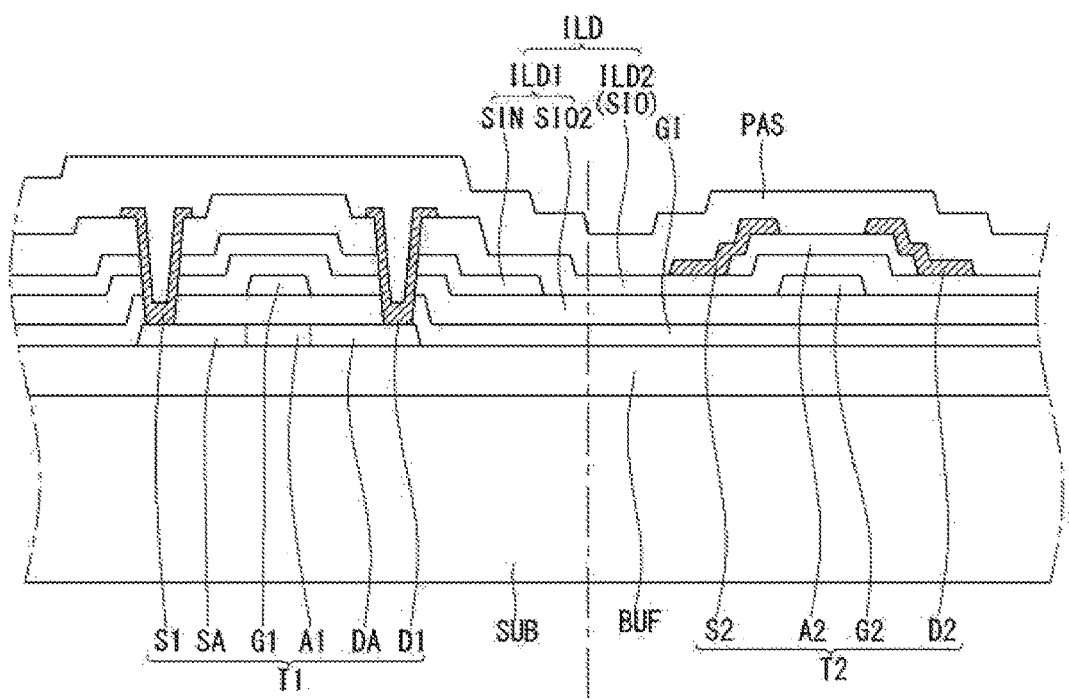
FIG. 20 is a cross-sectional view illustrating a structure of a TFT array substrate according to an eighth example embodiment.

FIG. 20 is a cross-sectional view illustrating a structure of a TFT array substrate according to an eighth example embodiment.

With reference to the example of FIG. 20, an oxide layer SIO may function as an interlayer dielectric layer in the first TFT T1, and may also function as a gate insulating layer of a second TFT T2. The interlayer dielectric layer ILD may have a first interlayer dielectric layer ILD1 and a second interlayer dielectric layer ILD2. The first interlayer dielectric layer ILD1 may have a stacked structure of a lower oxide layer SIO2 and a nitride layer SIN. The nitride layer SIN may be configured such that it is not disposed in the second area in which the second TFT T2 is disposed, but may selectively cover a first area in which the first TFT T1 is disposed. The second interlayer dielectric layer ILD2 may be made of the oxide layer SIO, and may function as a gate insulating layer of the second TFT T2.

By disposing the nitride layer SIN in the area in which the first TFT T1 is disposed, the hydrogen contained in the nitride layer SIN may be diffused into the first semiconductor layer A1 through a subsequent thermal process. When considering hydrogen diffusion efficiency, the nitride layer SIN may have a thickness of, e.g., about 1,000 Å to 3,000 Å. The lower oxide layer SIO2 may be made thin, e.g., about 500 Å to 1,000 Å.

Even when the nitride layer SIN has the thickness, e.g., of about 3,000 Å, the nitride layer SIN may be spaced a considerable distance apart from the second TFT T2. Therefore, the possibility that the hydrogen in the nitride layer SIN will be diffused into the second semiconductor layer A2 may be remarkably low. Moreover, because the oxide layer SIO corresponding to the second interlayer dielectric layer ILD2 may be further stacked over the nitride layer SIN, hydrogen may be prevented from being diffused into the second semiconductor layer A2. In this example embodiment, the first source and drain electrodes Si and D1 and the second source and drain electrodes S2 and D2 may be formed on the same layer using the same material, although embodiments are not limited thereto.

Figure 21:
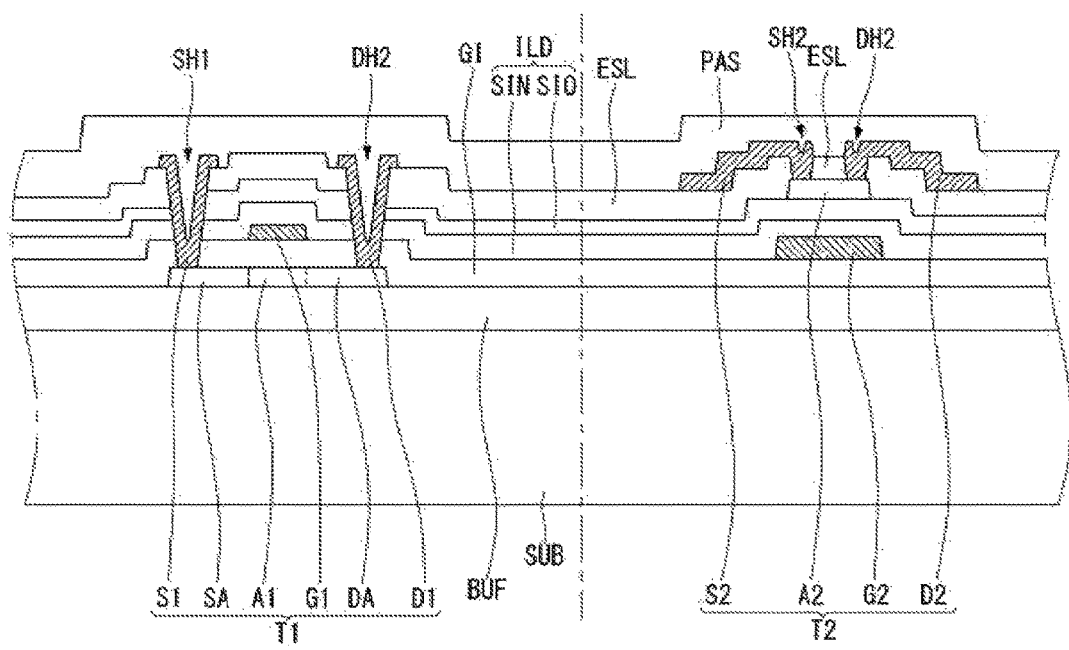
FIG. 21 is a cross-sectional view illustrating a structure of a TFT array substrate according to a ninth example embodiment.

FIG. 21 is a cross-sectional view illustrating a structure of a TFT array substrate according to a ninth example embodiment.

With reference to the example FIG. 21, a TFT array substrate may include a first TFT T1 and a second TFT T2 on a substrate SUB. The first and second TFTs T1 and T2 may be spaced apart from each other, may be disposed adjacent to each other, or may overlap each other.

A buffer layer BUF may be stacked over the entire surface of a substrate SUB. The buffer layer BUF may be omitted in come embodiments. In some embodiments, the buffer layer BUF may have a stacked structure of a plurality of thin film layers or a single layer. For convenience of explanation, the buffer layer BUF is illustrated as a single layer example. A light shielding layer may be optionally provided only in a desired portion between the buffer layer BUF and the substrate SUB. The light shielding layer may prevent external light from coming into a semiconductor layer of a TFT disposed on the light shielding layer.

A first semiconductor layer A1 may be disposed on the buffer layer BUF. The first semiconductor layer A1 may include a channel region of the first TFT T1. The channel region may be defined as an overlap portion of a first gate electrode G1 and the first semiconductor layer A1. As the first gate electrode G1 may overlap a center portion of the first TFT T1, the center portion of the first TFT T1 may become the channel region. Both sides of the channel region may be doped with impurities, and are defined as a source region SA and a drain region DA.

The first TFT T1 may be implemented as a p-type MOSFET TFT or as an n-type MOSFET TFT, or as a complementary MOSFET (CMOS). The semiconductor material of the first TFT T1 may be a polycrystalline semiconductor material, such as polycrystalline silicon.

A gate insulating layer GI may be stacked on the entire surface of the substrate SUB on which the first semiconductor layer A1 is disposed. The gate insulating layer GI may be made of, e.g., silicon nitride ($SiN_x$) or silicon oxide ($SiO_x$). The gate insulating layer GI may have a thickness of, e.g., about 1,000 Å to 1,500 Å in consideration of stability and characteristics of the element. The gate insulating layer GI made of silicon nitride ($SiN_x$) may contain a large amount of hydrogen due to its manufacturing process. The hydrogen atoms may diffuse out of the gate insulating layer GI in a subsequent process. Thus, the gate insulating layer GI may be made of a silicon oxide material.

The hydrogen diffusion may have a positive effect on the first semiconductor layer A1 including a polycrystalline silicon material. However, the hydrogen diffusion may have a negative effect on the second TFT T2 that may have different properties from the first TFT T1. In some embodiments, the gate insulating layer GI may be made thick, e.g., about 2,000 Å to 4,000 Å, unlike that described in the ninth example embodiment. If the gate insulating layer GI is made of silicon nitride ($SiN_x$), too much hydrogen may be diffused. So, taking multiple factors into consideration, the gate insulating layer GI may be made of silicon oxide ($SiO_x$).

The first gate electrode G1 and a second gate electrode G2 may be disposed on the gate insulating layer GI. The first gate electrode G1 may overlap the center portion of the first semiconductor layer A1. The second gate electrode G2 may be disposed in a portion of the second TFT T2. In an embodiment in which the first gate electrode G1 and the second gate electrode G2 may be made of the same material on the same layer by using the same mask, the manufacturing process can be simplified.

An interlayer dielectric layer ILD may be formed to cover the first and second gate electrodes G1 and G2. The interlayer dielectric layer ILD may have a multilayered structure in which a nitride layer SIN including silicon nitride ($SiN_x$) and an oxide layer SIO including silicon oxide ($SiO_x$) are alternately stacked. In this example embodiment, the interlayer dielectric layer ILD is described as a two-layer structure in which the oxide layer SIO is stacked on the nitride layer SIN, but embodiments are not limited thereto.

The nitride layer SIN may be configured such that the hydrogen in the nitride layer SIN is diffused through the subsequent thermal process to hydrogenate the first semiconductor layer A1 including polycrystalline silicon. On the other hand, the oxide layer SIO may prevent too much hydrogen, released from the nitride layer SIN due to the subsequent thermal process, from being diffused into the semiconductor material of the second TFT T2.

The hydrogen released from the nitride layer SIN may be diffused into the first semiconductor layer A1, which is disposed below the nitride layer SIN, with the gate insulating layer GI interposed between them. Accordingly, the nitride layer SIN may be disposed over the gate insulating layer GI, close to the first semiconductor layer A1. On the other hand, too much hydrogen released from the nitride layer SIN can be prevented from being diffused into the semiconductor material of the second TFT T2 on the nitride layer SIN. Accordingly, the oxide layer SIO may be formed on the nitride layer SIN. When considering the manufacturing process, a total thickness of the interlayer dielectric layer ILD may be, e.g., about 2,000 Å to 6,000 Å. The nitride layer SIN and the oxide layer SIO each may have a thickness of, e.g., about 1,000 Å to 3,000 Å. Also, for the hydrogen in the nitride layer SIN to exert as little effect as possible on a second semiconductor layer A2 while diffusing in abundance into the first semiconductor layer A1, the thickness of the oxide layer SIO may be greater than the thickness of the gate insulating layer GI. The oxide layer SIO may adjust a diffusion degree of hydrogen released from the nitride layer SIN. In this case, the oxide layer SIO may be made thicker than the nitride layer SIN.

The second semiconductor layer A2 overlapping the second gate electrode G2 may be disposed on the oxide layer SIO of the interlayer dielectric layer ILD. The second semiconductor layer A2 may include an oxide semiconductor material, such as indium gallium zinc oxide (IGZO), indium gallium oxide (IGO), and/or indium zinc oxide (IZO). The oxide semiconductor material may be suitable for display devices requiring a low-speed drive and/or low power consumption by an increase in a voltage hold time of the pixel resulting from a low off-current characteristic of the oxide semiconductor material.

An etch-stopper layer ESL may be formed on the second semiconductor layer A2. A second source contact hole SH2 and a second drain contact hole DH2 may be formed in the etch-stopper layer ESL to expose one side and the other side of the second semiconductor layer A2, respectively. A first source contact hole SH1 and a first drain contact hole DH2 may be formed to penetrate the etch-stopper layer ESL, the interlayer dielectric layer IDL, and the gate insulating layer GI, and may expose one side and the other side of the first semiconductor layer A1, respectively.

Although not shown, the etch-stopper layer ESL may be formed in an island pattern covering a center portion of the second semiconductor layer A2. In this case, because both sides of the second semiconductor layer A2 are exposed, the second source contact hole SH2 and second drain contact hole DH2 for exposing one side and the other side of the second semiconductor layer A2 may be omitted. Without the etch-stopper layer ESL on the first semiconductor layer A1, the first source contact hole SH1 and the first drain contact hole DH1 may penetrate the interlayer dielectric layer ILD and the gate insulating layer GI.

Source and drain electrodes may be formed on the etch-stopper layer ESL. A first source electrode S1 and a first drain electrode D1 may be spaced apart from each other at a predetermined distance while facing each other, with the first gate electrode G1 interposed between them. The first source electrode S1 may be connected to the source region SA, which may correspond to one side of the first semiconductor layer A1 exposed through the first source contact hole SH1. The first source contact hole SH1 may penetrate the etch-stopper layer ESL, the interlayer dielectric layer ILD, and the gate insulating layer GI, and may expose the source region SA corresponding to one side of the first semiconductor layer A1. The first drain electrode D1 may be connected to a drain region DA, which may correspond to the other side of the first semiconductor layer A1 exposed via the first drain contact hole DH1. The first drain contact hole DH1 may penetrate the etch-stopper layer ESL, the interlayer dielectric layer ILD, and the gate insulating layer GI, and may expose the drain region DA corresponding to the other side of the first semiconductor layer A1.

A second source electrode S2 and a second drain electrode D2 may be spaced a predetermined distance apart from each other, with the second gate electrode G2 interposed between them. The second source electrode S2 may contact one side of the second semiconductor layer A2 exposed via the second source contact hole SH2. The second drain electrode D2 may contact the other side of the second semiconductor layer A2 exposed via the second drain contact hole DH2. If the second source and drain electrodes S2 and D2 directly contact the upper surface of the second semiconductor layer A2, the conductivity of the second source and drain electrodes S2 and D2 may be diffused in a process for patterning the second source and drain electrodes S2 and D2, making it difficult to accurately define a channel region of the second semiconductor layer A2. In an embodiment, because the second semiconductor layer A2 including an oxide semiconductor material and the second source and drain electrodes S2 and D2 may be connected via the second source and drain contact holes SH2 and DH2, the size of a channel region of the second semiconductor layer A2 can be accurately defined.

The first TFT T1 and the second TFT T2 may be covered with a passivation layer PAS. Afterwards, the passivation layer PAS may be patterned to form more contact holes exposing the first drain electrode D1 and/or the second drain electrode D2. Moreover, a pixel electrode that may contact the first drain electrode D1 and/or the second drain electrode D2 via contact holes may be formed on the passivation layer PAS.

In one example embodiment, the first gate electrode G1 constituting the first TFT T1 and the second gate electrode G2 constituting the second TFT T2 may be formed on the same layer using the same material, although embodiments are not limited thereto. The first semiconductor layer A1 including the polycrystalline semiconductor material of the first TFT T1 may be below the first gate electrode G1, and the second semiconductor layer A2 including the oxide semiconductor material of the second TFT T2 may be on the second gate electrode G2. Thus, embodiments may prevent the oxide semiconductor material from being exposed at a high temperature during the manufacturing process by forming the first semiconductor layer A1 at a relatively high temperature, and then forming the second semiconductor layer A2 at a relatively low temperature. Accordingly, the first TFT T1 may have a top-gate structure because the first semiconductor layer A1 may be formed earlier than the first gate electrode G1. The second TFT T2 may have a bottom-gate structure because the second semiconductor layer A2 may be formed later than the second gate electrode G2.

A hydrogenation process of the first semiconductor layer A1 including the polycrystalline semiconductor material may be performed simultaneously with a thermal process of the second semiconductor layer A2 including the oxide semiconductor material. To this end, the interlayer dielectric layer ILD may have a structure in which the oxide layer SIO is stacked on the nitride layer SIN. Because of characteristic of the manufacturing process, the hydrogenation process may diffuse the hydrogen contained in the nitride layer SIN into the first semiconductor layer A1 through the thermal process. Moreover, the thermal process may stabilize the second semiconductor layer A2 including the oxide semiconductor material. The hydrogenation process may be performed after stacking the interlayer dielectric layer ILD on the first semiconductor layer A1, and the thermal process may be formed after forming the second semiconductor layer A2. The oxide layer SIO stacked on the nitride layer SIN and under the second semiconductor layer A2 may prevent too much hydrogen contained in the nitride layer SIN from being diffused into the second semiconductor layer A2 including the oxide semiconductor material. Thus, the hydrogenation process may be performed simultaneously with the thermal process for stabilizing the oxide semiconductor material.

At least one of the first and second TFTs T1 and T2 may be a TFT that is formed in each pixel of the display panel 10, and that switches the data voltage written to the pixels on and off or drives the pixels. In the case of an OLED display, the second TFT T2 may be used as a switching element of each pixel, and the first TFT T1 may be used as a driving element, but the embodiment of the invention is not limited thereto. The switching element may be a switching element T illustrated in FIGS. 21 and 22 or a switching element ST illustrated in FIGS. 23 and 24. The driving element may be the driving element DT illustrated in FIGS. 23 and 24. The first and second TFTs T1 and T2 may be combined into a single switching element or a single driving element.

There have been attempts to perform a low-speed driving method for reducing a frame rate to reduce power consumption for mobile devices or wearable devices. With such a method, a frame frequency of a still image or an image having a slow data update cycle may be reduced. A reduction in the frame frequency may generate a flicker. The flicker allows the luminance to flicker each time the data voltage varies or the luminance to flicker with each data update cycle due to an increase in a voltage discharge time of the pixel. By adapting the first and second TFTs T1 and T2 according to embodiments, the flicker problem generated during the related art low-speed drive can be resolved.

An increase in the data update cycle during the low-speed drive may increase the leakage current of the switching TFTs. The leakage current of the switching TFTs may lead to a reduction in the voltage of the storage capacitor and a reduction in the gate-source voltage of the driving TFT. In an embodiment, the second TFT T2, which may be an oxide transistor, may be used as a switching element of each pixel. The oxide transistor can prevent the reduction in the voltage of the storage capacitor and the reduction in the gate-source voltage of the driving elements because of its low off-current. Accordingly, embodiments can prevent flicker during the low-speed drive.

If the first TFT, which may be a polycrystalline silicon transistor, is used as a driving element of each pixel, the amount of electric current in the OLED can be increased due to high mobility of electrons. Therefore, embodiments can prevent degradation in the image quality while reducing the power consumption, by using the second TFT T2 as a switching element of each pixel and the first TFT T1 as a driving element of each pixel.

Embodiments can be efficiently adapted to mobile devices or wearable devices because they may prevent the degradation in image quality by using the low-speed driving method to reduce the power consumption. For example, a smart watch may update data on the display screen every second to reduce power consumption. In one case, the frame frequency may be about 1 Hz. Embodiments may provide excellent, flicker-free image quality, even at 1 Hz or at a driving frequency close to those for still images. Embodiments can greatly reduce the power consumption without the degradation in the image quality by delivering still images at a much lower frame rate on the standby screen of a mobile or wearable device. As a consequence, embodiments can enhance the image quality of mobile or wearable devices and lengthen battery life, thereby increasing portability. Embodiments can greatly reduce power consumption, even for E-books, which have very long data update cycles, without degradation in image quality.

The first and second TFTs T1 and T2 may be used as switching elements or driving elements in at least one driving circuit, for example, at least one among the data driver 12, the multiplexer, and the scan driver 13 shown in the FIG. 2 example. Such a driving circuit may write data to the pixels. Also, one of the first and second TFTs T1 and T2 may be provided within a pixel, and the other may be provided in a driving circuit. The data driver 12 may convert data of an input image into a data voltage and may output the data voltage. The multiplexer may reduce the number of output channels for the data driver 12 by distributing a data voltage from the data driver 12 among a plurality of data lines 24. The scan driver 13 may output a scan signal (or gate signal) synchronized with the data voltage to gate lines 15, and may sequentially select pixels, line-by-line, to which the input image data is to be written. To reduce the number of output channels for the scan driver 13, an additional multiplexer (not shown) may be disposed between the scan driver 13 and the gate lines 15. The multiplexer and the scan driver 13 may be formed directly on the TFT array substrate, along with a pixel array, as shown in FIG. 13. The multiplexer and the scan driver 13 may be disposed in a non-display area NA, and the pixel array may be disposed in a display area AA.

A display device of an embodiment may be an active-matrix display using TFTs, for example, any display device that requires TFTs, such as a liquid crystal display (LCD), an OLED display, etc. Hereinafter, examples of a display device to which a TFT array substrate of embodiments may be applied will be described in conjunction with FIGS. 21 to 26.

Figure 22:
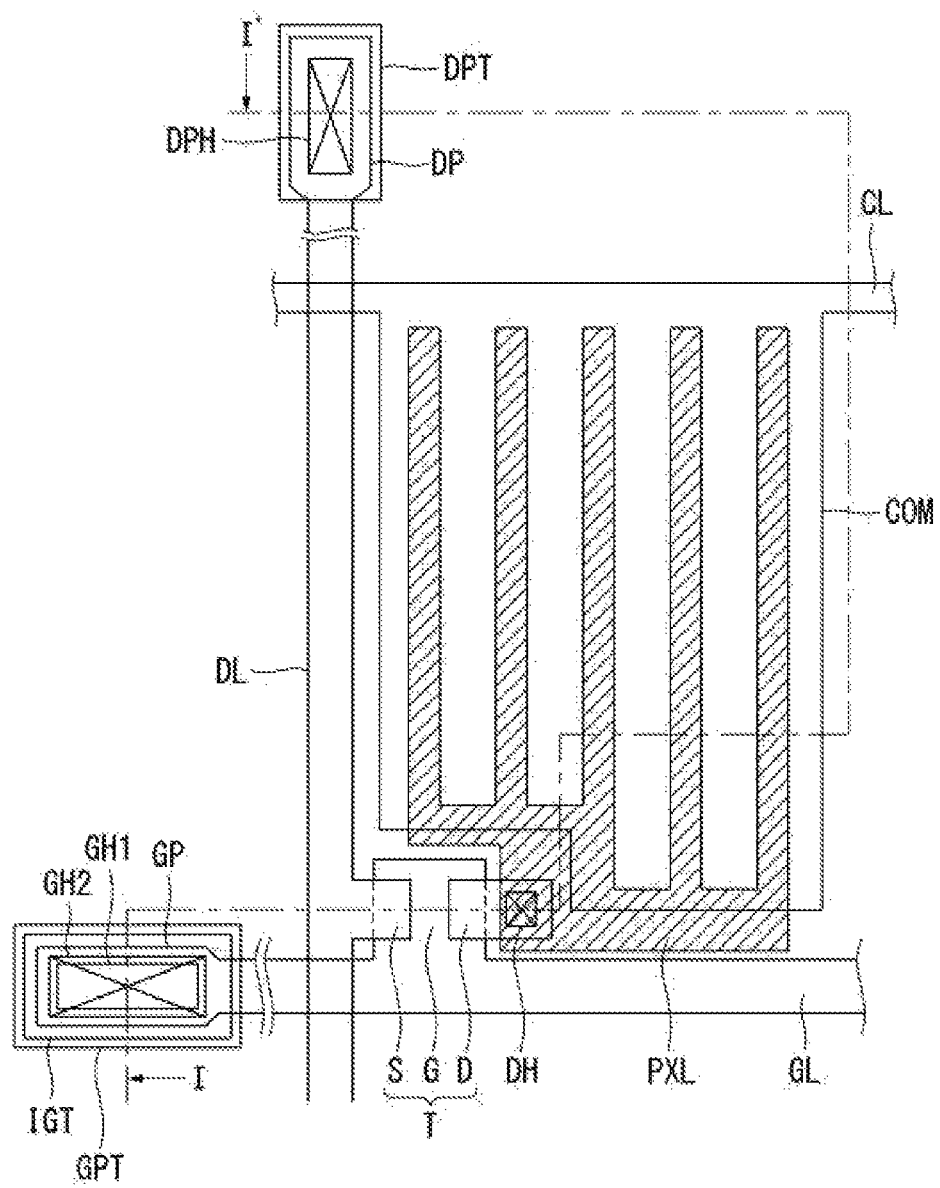
FIG. 22 is a plan view illustrating a TFT array substrate for a liquid crystal display.
Figure 23:
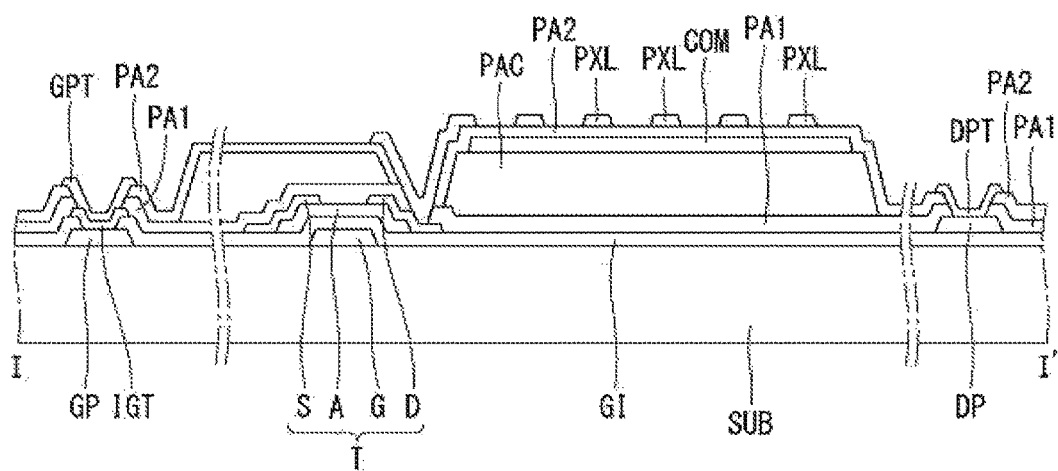
FIG. 23 is a cross-sectional view of a TFT array substrate taken along line I-I' of FIG. 22.

FIG. 22 is a plan view illustrating a TFT array substrate for a liquid crystal display. FIG. 23 is a cross-sectional view of a TFT array substrate taken along line I-I' of FIG. 22.

FIG. 22 shows a TFT array substrate for a fringe-field-switching liquid crystal display, that is a kind of a horizontal electric field type liquid crystal display. With reference to the examples of FIGS. 21 and 22, the TFT array substrate may include gate lines GL (e.g., gate lines 15 of FIG. 2) and data lines DL (e.g., data lines 24 of FIG. 2) that intersect each other, with a gate insulating layer GI interposed between them, on a lower substrate SUB, and TFTs T formed at intersections of the gate lines GL and the data lines DL. Pixel areas are defined by the intersections of the gate lines GL and data lines DL.

Each TFT T may include a gate electrode G branched from a gate line GL, a source electrode S branched from a data line DL, a drain electrode D facing the source electrode S, and a semiconductor layer A that overlaps the gate electrode G over the gate insulating layer GI and forms a channel region between the source electrode S and the drain electrode D. For example, when the semiconductor layer A is made of an oxide semiconductor material, the semiconductor layer A may be suitable for display devices requiring low-speed driving and/or low power consumption through an increase in a voltage hold time of the pixel resulting from a low off-current characteristic of the oxide semiconductor material. Owing to this characteristic, the capacitance of the storage capacitor can be reduced. Thus, the oxide semiconductor material may be beneficial when implementing a super-high resolution display device having a small unit pixel area.

A gate pad GP may be provided at one end of the gate line GL to receive a gate signal from the outside. The gate pad GP may contact a gate pad intermediate terminal IGT via a first gate pad contact hole GH1 penetrating the gate insulating layer GI. The gate pad intermediate terminal IGT may contact a gate pad terminal GPT via a second gate pad contact hole GH2 penetrating a first passivation layer PA1 and a second passivation layer PA2. A data pad DP may be provided at one end of the data line DL to receive a pixel signal from the outside. The data pad DP may contact a data pad terminal DPT via a data pad contact hole DPH penetrating the first passivation layer PA1 and the second passivation layer PA2.

A pixel electrode PXL and a common electrode COM may be formed in the pixel area with the second passivation layer PA2 interposed between them to form a fringe field. The common electrode COM may be connected to a common line CL arranged parallel to the gate line GL. The common electrode COM may receive a reference voltage (or common voltage) for driving the liquid crystal through the common line CL. In another method, the common electrode COM may be formed over the entire surface of the substrate SUB, except a portion in which a drain contact hole is formed. That is, the common electrode COM may cover the upper part of the data line DL, and therefore, may function to block the data line DL.

The positions and shapes of the common electrode COM and pixel electrode PXL may vary depending on the design environment and purpose. A constant reference voltage may be applied to the common electrode COM, whereas a voltage that constantly varies with video data may be applied to the pixel electrode PXL. Thus, a parasitic capacitance may be generated between the data line DL and the pixel electrode PXL. This parasitic capacitance can cause a problem for image quality. Thus, the common electrode COM may be formed first, and then, the pixel electrode PXL may be formed on the uppermost layer.

The common electrode COM may be formed after a thick planarization layer PAC made of a low-dielectric-constant material is formed on the first passivation layer PA1 covering the data line DL and the TFT. Next, the second passivation layer PA2 covering the common electrode COM may be formed, and then, the pixel electrode PXL overlapping the common electrode COM may be formed on the second passivation layer PA2. In this structure, the pixel electrodes PXL may be spaced apart from the data line DL by the first passivation layer PA1, the planarization layer PAC, and the second passivation layer PA2. Thus, the parasitic capacitance between the data line DL and the pixel electrode PXL can be reduced.

The common electrode COM may be formed in a rectangular shape corresponding to the shape of the pixel area, and the pixel electrode PXL may be formed in the shape of multiple separate lines. The pixel electrode PXL may vertically overlap the common electrode COM, with the second passivation layer PA2 interposed between them. Accordingly, a fringe field may be formed between the pixel electrode PXL and the common electrode COM. By the fringe electric field, liquid crystal molecules arranged with their axes parallel to each other between the TFT array substrate and a color filter substrate may rotate by dielectric anisotropy. As the fringe field may be formed between the pixel electrode PXL and the common electrode COM, the liquid crystal molecules arranged with their axes parallel to each other between the TFT array substrate and the color filter substrate may rotate by dielectric anisotropy. Also, a transmittance of light through the pixel area may vary with the degree of rotation of the liquid crystal molecules, thereby representing grayscale levels. The TFT T used as a switching element of each pixel in a liquid crystal display may be implemented as the first TFT T1 and/or the second TFT T2.

Figure 24:
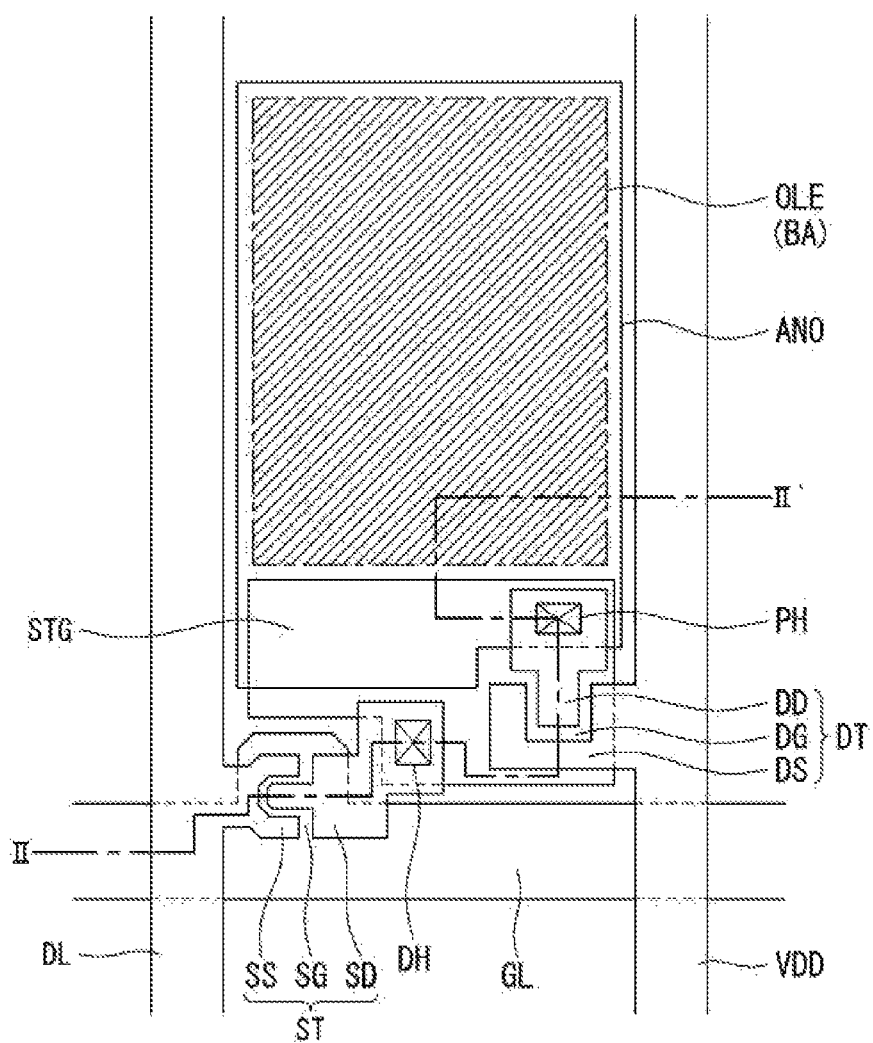
FIG. 24 is a plan view illustrating a structure of a pixel in an OLED display.
Figure 25:
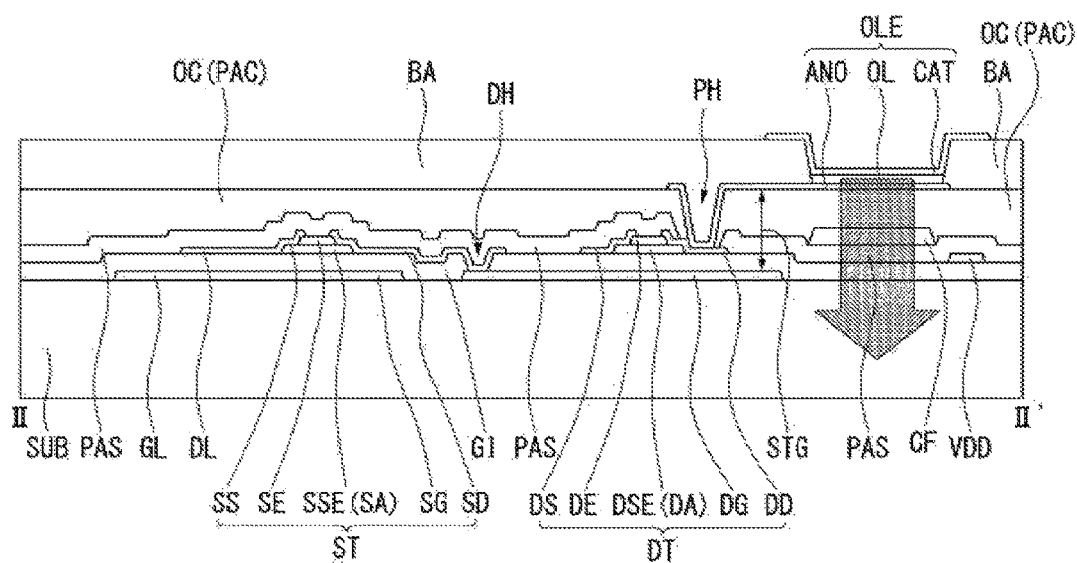
FIG. 25 is a cross-sectional view of an active matrix OLED display taken along line II-IF of FIG. 24.

FIG. 24 is a plan view illustrating a structure of a pixel in an OLED display. FIG. 25 is a cross-sectional view of an active matrix OLED display taken along line II-IF of FIG. 24.

With reference to the examples of FIGS. 23 and 24, an OLED display may include a switching TFT ST, a driving TFT DT connected to the switching TFT ST, and an OLED connected to the driving TFT DT. The switching TFT ST may be formed at an intersection of a gate line GL and a data line DL. The switching TFT ST may select the pixel by supplying a data voltage from the data line DL to a gate electrode of the driving TFT DT and a storage capacitor STG in response to a scan signal. The switching TFT ST may include a gate electrode SG branched from the gate line GL, a semiconductor layer SA, a source electrode SS, and a drain electrode SD. The driving TFT DT may drive an OLED of the pixel selected by the switching TFT ST by adjusting an electric current flowing in the OLED of the pixel based on a gate voltage. The driving TFT DT may include a gate electrode DG connected to the drain electrode SD of the switching TFT ST, a semiconductor layer DA, a source electrode DS connected to a driving current line VDD, and a drain electrode DD. The drain electrode DD of the driving TFT DT may be connected to an anode ANO of the OLED. An organic emission layer OL may be interposed between the anode ANO and a cathode CAT. The cathode CAT may be connected to a ground voltage line. The storage capacitor STG may be connected to the driving TFT D1, and may hold a gate-source voltage of the driving TFT D1.

The gate electrodes SG and DG of the switching TFT ST and the driving TFT DT may be disposed on a substrate SUB. A gate insulating layer GI may cover the gate electrodes SG and DG. The semiconductor layers SA and DA may be disposed on a portion of the gate insulating layer GI overlapping the gate electrodes SG and DG. The source electrodes SS and DS and the drain electrodes SD and DD may be arranged on the semiconductor layers SA and DA and face each other at a predetermined distance. The drain electrode SD of the switching TFT ST may contact the gate electrode DG of the driving TFT DT via a drain contact hole DH penetrating the gate insulating layer GI. A passivation layer PAS covering the switching TFT ST and the driving TFT DT having the above-described structure may be formed on the entire surface.

A color filter CF may be disposed at a location corresponding to the anode ANO. The surface area of the color filter CF may be as wide as possible. For example, the color filter CF may have such a shape that overlaps a large area of the data line DL, the driving current line VDD, and the gate line GL of a previous stage. As such, the surface of the substrate on which the switching TFTs ST, the driving TFTs DT, and the color filters CF are disposed may be uneven with many irregularities. The organic emission layer OL may need to be stacked on a flat surface to emit constant and uniform light. A planarization layer PAC or an overcoat layer OC may be formed on the entire surface of the substrate for the purpose of smoothing out the substrate surface.

The anode ANO of the OLED may be formed on the overcoat layer OC. The anode ANO may be connected to the drain electrode DD of the driving TFT via a pixel contact hole PH formed in the overcoat layer OC and the passivation layer PAS.

The anode ANO of the OLED may be formed on the overcoat layer OC. The anode ANO may be connected to the drain electrode DD of the driving TFT via a pixel contact hole PH formed in the overcoat layer OC and passivation layer PAS.

To define a pixel area on the substrate with the anode ANO formed on it, a bank (or a bank pattern) BA may be formed on the area in which the switching TFT ST, the driving TFT DT, and various types of signal lines DL, SL, and VDD are formed. The anode ANO exposed by the bank BA may serve as an emission region. The organic emission layer OL may be stacked on the anode ANO exposed by the bank BA. The cathode CAT may then be stacked on the organic emission layer OL. The organic emission layer OL may be made of an organic material that emits white light. The color assigned to each pixel may be represented by the color filter CF that is located below the organic emission layer OL.

The storage capacitor STG may be formed between the gate electrode DG of the driving TFT and the anode ANO. The storage capacitor STG may be connected to the driving TFT DT, and may hold the voltage applied to the gate electrode DG of the driving TFT DT.

The semiconductor layer of the TFT may be formed of a metal oxide semiconductor material, e.g., a second semiconductor layer A2. The characteristics of the metal oxide semiconductor material may rapidly deteriorate when it is voltage-driven while being exposed to light. Accordingly, the upper and lower parts of the semiconductor layer may block light coming from outside.

The pixel areas on the above-described TFT substrate may be arranged in a matrix. At least one TFT may be disposed in each unit pixel area. That is, a plurality of TFTs may be distributed across the entire area of the substrate.

More TFTs may be disposed in the pixels of the OLED display, in addition to the TFTs ST and DT illustrated in FIGS. 23 and 24. If desired, compensation TFTs for compensating for pixel degradation may be further provided to complement functionality or performance of the OLED display.

A TFT array substrate with driving elements embedded in the non-display area NA of the display device may be used. With reference to the examples of FIGS. 25 and 26, a description will be given regarding an example in which a portion of the driving circuit is formed directly on a TFT substrate with pixels thereon.

Figure 26:
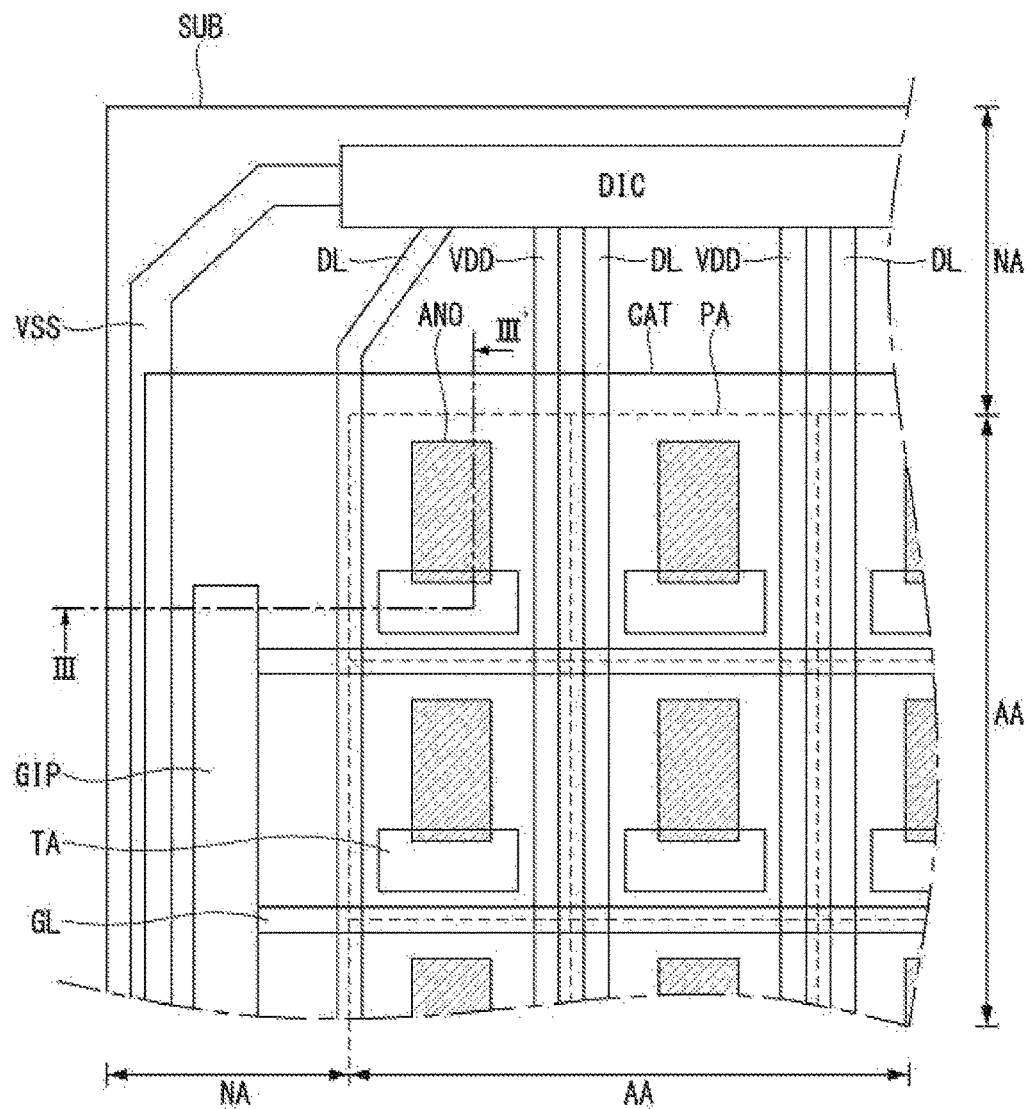
FIG. 26 is an enlarged plan view showing a schematic structure of an OLED display.
Figure 27:
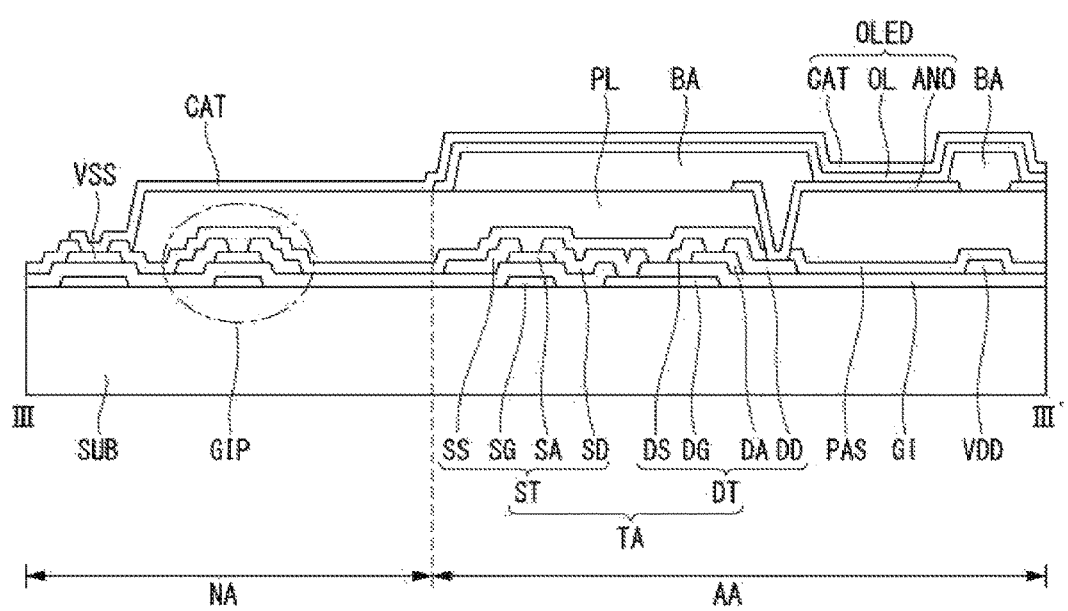
FIG. 27 shows a cross-sectional view of an OLED display taken along line of FIG. 26.

FIG. 26 is an enlarged plan view showing a schematic structure of an OLED display. FIG. 27 shows a cross-sectional view of the OLED display taken along line of FIG. 26. A detailed description of the TFTs and OLEDs formed in the display area will be omitted.

With reference to the FIG. 26 example, a planar structure of the OLED display will be described. The OLED display may include a substrate SUB that may be divided into a display area AA in which image information is displayed, and a non-display area NA in which a number of elements for driving the display area AA are disposed. In the display area AA, a plurality of pixel areas PA arranged in a matrix may be defined in the display area AA. In FIG. 26, the pixel areas PA are indicated by dotted lines.

The pixel areas PA may be of the same size or of different sizes. Also, the pixel areas PA may be regularly arranged in repeating a pixel unit including three subpixels respectively representing, for example, red (R), green (G), and blue (B) colors. Each pixel may further include a W (white) subpixel. For example, the pixel areas PA may be defined by intersections of a plurality of gate lines GL extended horizontally and a plurality of data lines DL and driving current lines VDD extended vertically.

A data integrated circuit (IC) DIC, with which a data driver supplying signals corresponding to image information to the data lines DL may be integrated, and a gate driver GIP for supplying scan signals to the gate lines GL may be disposed in the non-display area NA defined around the perimeter of the pixel areas PA. In the FIG. 26 example, the multiplexer 112 is omitted, although embodiments are not limited thereto. In example displays that require more data lines DL and driving current lines VDD and provide a higher resolution than VGA, the data IC DIC may be mounted outside the substrate SUB, and data connection pads may be disposed instead of the data IC DIC.

To simplify the structure of the display device, the gate driver GIP may be formed directly on one side of the substrate SUB. A ground voltage line (not shown) for supplying a ground voltage may be disposed on the outermost part of the substrate SUB. The ground voltage line may be disposed in such a way that the ground voltage line may receive a ground voltage from outside of the substrate SUB, and may supply the ground voltage to both the data IC DIC and the gate driver GIP. For example, the ground voltage line may be connected to the data IC DIC, which may be mounted separately on an upper side of the substrate SUB, and may wrap around the substrate SUB on the outside of the gate driver GIP on the left side and/or the right side of the substrate SUB.

An OLED and TFTs, which are the core elements of an OLED display, may be disposed in each pixel area PA. The TFTs may be formed in a TFT area TA defined at one side of the pixel area PA. The OLED may include an anode ANO, a cathode CAT, and an organic emission layer OL interposed between the two electrodes. An actual emission region is determined by the area of the organic emission layer OL overlapping the anode ANO.

The anode ANO may occupy a portion of the pixel area PA, and may be connected to the TFT formed in the TFT area TA. The organic emission layer OL may be deposited on the anode ANO, and the overlap area of the anode ANO and the organic emission layer OL is the actual emission region. The cathode CAT on the organic emission layer OL may be formed as a single body to entirely cover the display area AA in which the pixel areas PA are disposed.

The cathode CAT may contact the ground voltage line that is disposed outside the substrate SUB beyond the gate driver GIP. That is, the ground voltage may be applied to the cathode CAT via the ground voltage line. When the ground voltage is applied to the cathode CAT and an image voltage is applied to the anode ANO, the voltage difference between them causes the organic emission layer OL to emit light, thereby displaying image information.

The cathode CAT may be made, e.g., of a transparent conductive material, such as indium tin oxide or indium zinc oxide. Such a transparent conductive material may have higher resistivity than metals. Top-emission type displays may have no resistance problem because the anode ANO is made of metal, which has low resistance and high light reflectance. In contrast, the cathode CAT may be made of a transparent conductive material because light has to pass through the cathode CAT.

The gate driver GIP may be provided with TFTs, which may be formed together in the process of forming switching TFTs ST and driving TFTs DT. The switching TFT formed in the pixel area PA may include a gate electrode SG, a gate insulating layer GI, a channel layer SA, a source electrode SS, and a drain electrode SD. The driving TFT DT may include a gate electrode DG connected to the drain electrode SD of the switching TFT ST, the gate insulating layer GI, a channel layer DA, a source electrode DS, and a drain electrode DD.

A passivation layer PAS and a planarization layer PL may be consecutively deposited on the TFTs ST and DT. An isolated, rectangular anode ANO that occupies only a portion of the pixel area PA may be formed on the planarization layer PL. The anode ANO may contact the drain electrode DD of the driving TFT DT via a contact hole penetrating the passivation layer PAS and the planarization layer PL.

A bank BA defining an emission region may be disposed on the substrate SUB on which the anode ANO is formed. The bank BA may expose most of the anode ANO. An organic emission layer OL may be stacked on the anode ANO exposed onto the bank BA pattern. A cathode CAT made of a transparent conductive material may be stacked over the bank BA. As such, an OLED including the anode ANO, the organic emission layer OL, and the cathode CAT may be formed.

The organic emission layer OL may produce white light and represent the color through a separate color filter CF. In one example, the organic emission layer OL may be stacked in such a way as to cover at least the display area AA.

The cathode CAT may cover the display area AA and the non-display area NA to contact the ground voltage line that is disposed outside the substrate SUB beyond the gate driver GIP. In this way, the ground voltage may be applied to the cathode CAT via the ground voltage line.

The ground voltage line may be formed on the same layer and using the same material as the gate electrode SG, although embodiments are not limited thereto. In one embodiment, the ground voltage line may contact the cathode CAT via a contact hole that penetrates the passivation layer PAS and the gate insulating layer GI covering the ground voltage line. In another embodiment, the ground voltage line may be formed on the same layer and using the same material as the source and drain electrodes SS, SD and DS, DD, although embodiments are not limited thereto. In one example, the ground voltage line may contact the cathode CAT via a contact hole penetrating the passivation layer PAS.

A second TFT T2 including an oxide semiconductor layer may be used as the switching TFT ST. A first TFT T1 including a polycrystalline semiconductor layer may be used as the driving TFT DT. The first TFT T1 including a polycrystalline semiconductor layer may be used for the gate driver GIP. If desired, the TFTs of the gate driver GIP may be implemented as CMOS.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. An organic light-emitting diode (OLED) display, comprising:
    a display panel comprising a plurality of pixels, each pixel comprising an OLED, an emission timing of each pixel being controlled in response to an EM signal;
    a shift register configured to generate an anti-phase EM signal based on gate shift clocks; and
    an inverter configured to:
        invert a phase of the anti-phase EM signal based on emission shift clocks; and
        generate the EM signal,
    wherein a driving frequency of the shift register and a driving frequency of the inverter are both lower in a low-speed driving mode than in a normal driving mode, and
    wherein, in the low-speed driving mode, an amplitude of the emission shift clocks is less than an amplitude of the gate shift clocks.

2. The display of claim 1, wherein:
    the shift register is further configured to supply the anti-phase EM signal to an input node of the inverter through an output line; and
    the inverter comprises a ripple suppression capacitor connected between the input node and an input terminal of a gate low voltage, the ripple suppression capacitor being configured to suppress a ripple on the anti-phase EM signal.

3. The display of claim 1, wherein, in the low-speed driving mode:
    the gate shift clocks swing between a gate high voltage and a gate low voltage;
    the emission shift clocks swing between the gate high voltage and a first gate low voltage; and
    a level of the first gate low voltage is greater than a level of the gate low voltage.

4. The display of claim 1, wherein, in the low-speed driving mode:
    the gate shift clocks swing between a gate high voltage and a gate low voltage;
    the emission shift clocks swing between a first gate high voltage and the gate low voltage; and
    a level of the first gate high voltage is less than a level of the gate high voltage.

5. The display of claim 1, wherein the inverter comprises:
    a plurality of switches comprising a plurality of series-connected switch pairs, at least one of the switches among the plurality of switches having a gate connected to the gates of at least one pair among the plurality of series-connected switch pairs; and
    a boosting capacitor having one end connected between at least two pairs among the plurality of series-connected switch pairs.

6. The display of claim 1, wherein the inverter comprises:
    a first switch comprising:
        a gate electrode connected to a boosting capacitor at a storage node;
        a drain electrode connected to an input terminal of a gate high voltage; and
        a source electrode connected to an output node;
    a second switch comprising:
        a gate electrode connected to a first intermediate node;
        a drain electrode connected to the output node; and
        a source electrode connected to a second intermediate node;
    a third switch comprising:
        a gate electrode connected to the first intermediate node;
        a drain electrode connected to the second intermediate node; and
        a source electrode connected to an input terminal of a gate low voltage;
    a fourth switch comprising:
        a gate electrode connected to an input terminal of an emission shift clocks;
        a drain electrode connected to the input terminal of the gate high voltage; and
        a source electrode connected to the storage node;
    a fifth switch comprising:
        a gate electrode connected to an input node;
        a drain electrode connected to the storage node; and
        a source electrode connected to the input terminal of the gate low voltage;
    a sixth switch comprising:
        a gate electrode connected to the output node;
        a drain electrode connected to the input terminal of the gate high voltage; and
        a source electrode connected to the second intermediate node.

7. An organic light-emitting diode (OLED) display, comprising:
    a display panel comprising a plurality of pixels, each pixel comprising an OLED, an emission timing of each pixel being controlled in response to an EM signal;
    a shift register configured to generate an anti-phase EM signal based on gate shift clocks; and
    an inverter configured to:
        invert a phase of the anti-phase EM signal based on emission shift clocks; and
        generate the EM signal,
    wherein the shift register is further configured to supply the anti-phase EM signal to an input node of the inverter through an output line,
    wherein the inverter comprises a ripple suppression capacitor connected between the input node and an input terminal of a gate low voltage, the ripple suppression capacitor being configured to suppress a ripple on the anti-phase EM signal, wherein a driving frequency of the shift register and a driving frequency of the inverter are both lower in a low-speed driving mode than in a normal driving mode, and wherein, in the low-speed driving mode, an amplitude of the emission shift clocks is less than an amplitude of the gate shift clocks.

8. The display of claim 7, wherein, in the low-speed driving mode:
the gate shift clocks swing between a gate high voltage and a gate low voltage;
the emission shift clocks swing between the gate high voltage and a first gate low voltage; and
a level of the first gate low voltage is greater than a level of the gate low voltage.

9. The display of claim 7, wherein, in the low-speed driving mode:
the gate shift clocks swing between a gate high voltage and a gate low voltage;
the emission shift clocks swing between a first gate high voltage and the gate low voltage; and
a level of the first gate high voltage is less than a level of the gate high voltage.

10. The display of claim 7, wherein the inverter further comprises:
a plurality of switches comprising a plurality of series-connected switch pairs, at least one of the switches among the plurality of switches having a gate connected to the gates of at least one pair among the plurality of series-connected switch pairs; and
a boosting capacitor CB having one end connected between at least two pairs among the plurality of series-connected switch pairs.

11. The display of claim 7, wherein the inverter further comprises:
a first switch comprising:
a gate electrode connected to a boosting capacitor at a storage node;
a drain electrode connected to an input terminal of a gate high voltage; and
a source electrode connected to an output node;
a second switch comprising:
a gate electrode connected to a first intermediate node;
a drain electrode connected to the output node; and
a source electrode connected to a second intermediate node;
a third switch comprising:
a gate electrode connected to the first intermediate node;
a drain electrode connected to the second intermediate node; and
a source electrode connected to an input terminal of a gate low voltage;
a fourth switch comprising:
a gate electrode connected to an input terminal of an emission shift clocks;
a drain electrode connected to the input terminal of the gate high voltage; and
a source electrode connected to the storage node;
a fifth switch comprising:
a gate electrode connected to an input node;
a drain electrode connected to the storage node; and
a source electrode connected to the input terminal of the gate low voltage;
a sixth switch comprising:
a gate electrode connected to the output node;
a drain electrode connected to the input terminal of the gate high voltage; and
a source electrode connected to the second intermediate node.

12. A method of driving an organic light-emitting diode (OLED) display including a display panel having a plurality of pixels, each pixel including an OLED, an emission timing of each pixel being controlled in response to an EM signal, the method comprising:
generating, by a shift register, an anti-phase EM signal based on gate shift clocks; and
by an inverter:
inverting a phase of the anti-phase EM signal based on emission shift clocks; and
generating the EM signal,
wherein a driving frequency of the shift register and a driving frequency of the inverter are both lower in a low-speed driving mode than in a normal driving mode, and
wherein, in the low-speed driving mode, an amplitude of the emission shift clocks is less than an amplitude of the gate shift clocks.

13. The method of claim 12, wherein, in the low-speed driving mode:
the gate shift clocks swing between a gate high voltage and a gate low voltage;
the emission shift clocks swing between the gate high voltage and a first gate low voltage; and
a level of the first gate low voltage is greater than a level of the gate low voltage.

14. The method of claim 12, wherein, in the low-speed driving mode:
the gate shift clocks swing between a gate high voltage and a gate low voltage;
the emission shift clocks swing between a first gate high voltage and the gate low voltage; and
a level of the first gate high voltage is less than a level of the gate high voltage.

* * * * *